US012802760B2

(12) United States Patent
Kim et al.

(10) Patent No.: US 12,802,760 B2
(45) Date of Patent: Nov. 17, 2026

(54) STORAGE DEVICE WITH STATE SHAPING AND METHOD OF OPERATING THE SAME

(71) Applicant: SAMSUNG ELECTRONICS CO., LTD., Suwon-si (KR)

(72) Inventors: Minuk Kim, Suwon-si (KR); Soonyoung Kang, Suwon-si (KR); Kwanwoo Noh, Suwon-si (KR); Dong-Min Shin, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 236 days.

(21) Appl. No.: 18/408,126

(22) Filed: Jan. 9, 2024

(65) Prior Publication Data

US 2025/0014647 A1 Jan. 9, 2025

(30) Foreign Application Priority Data

Jul. 7, 2023 (KR) ........................ 10-2023-0088659

(51) Int. Cl.
*G11C 16/10* (2006.01)
*G11C 16/08* (2006.01)

(52) U.S. Cl.
CPC ............ *G11C 16/102* (2013.01); *G11C 16/08* (2013.01)

(58) Field of Classification Search
None
See application file for complete search history.

(56) References Cited

U.S. PATENT DOCUMENTS 8,432,735 B2 4/2013 Kim et al.
8,806,302 B2 8/2014 Kim et al.
9,524,794 B1 12/2016 Shapira
9,575,683 B2 2/2017 Achtenberg et al.
9,734,898 B2 * 8/2017 Seol .................... G06F 12/0246
10,949,119 B2 3/2021 Rozman et al.
11,322,208 B2 5/2022 Seo et al.
11,372,551 B2 6/2022 Choi et al.

* cited by examiner

*Primary Examiner* — Alfredo Bermudez Lozada
(74) *Attorney, Agent, or Firm* — Sughrue Mion, PLLC

(57) ABSTRACT

A storage device includes a nonvolatile memory device including a plurality of first memory cells coupled to a first wordline and a plurality of second memory cells coupled to a second wordline, the first wordline and the second word-line being adjacent to each other, and a storage controller configured to control the nonvolatile memory device. The storage controller is further configured to encode data to be programmed into the plurality of second memory cells, based on a program state of each of the plurality of first memory cells, and encode the data to be programmed into the second wordline such that a first portion of the data to be written into a first portion of the plurality of second memory cells satisfies a first condition, and a second portion of the data to be written into a second portion of the plurality of second memory cells satisfies a second condition.

20 Claims, 18 Drawing Sheets

FIG. 11A

| | | MC1 | MC2 | MC3 | MC4 | MC5 | MC6 | MC7 | MC8 |
|---|---|---|---|---|---|---|---|---|---|
| WLn | LSB | 1 | 1 | 0 | 0 | 0 | 1 | 1 | 0 |
| | CSB | 1 | 0 | 1 | 1 | 0 | 0 | 1 | 0 |
| | MSB | 1 | 1 | 0 | 1 | 1 | 0 | 0 | 0 |
| | Program State | E | P7 | P4 | P1 | P2 | P6 | P5 | P3 |

[program status of adjacent cells of WLn]

FIG. 11B

| | MC1 | MC2 | MC3 | MC4 | MC5 | MC6 | MC7 | MC8 |
|---|---|---|---|---|---|---|---|---|
| WLn | P_L | P_H | P_H | P_L | P_L | P_H | P_H | P_L |

[Program Pattern Information]

FIG. 11C

| | | MC1 | MC2 | MC3 | MC4 | MC5 | MC6 |
|---|---|---|---|---|---|---|---|
| WLn+1 | LSB | 0 | 1 | 1 | 1 | 1 | 1 |
| | CSB | 1 | 1 | 1 | 1 | 0 | 0 |
| | MSB | 1 | 1 | 1 | 0 | 1 | 1 |
| | Program State | P1 | E | E | P5 | P7 | P7 |

[program status of original data ]

FIG. 12B $$\begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \end{bmatrix}$$

FIG. 12C

Shaping Target Pattern of P_L

Shaping Target Pattern of P_H

| | | |
|---|---|---|
| LSB | 1 | 1 |
| CSB | 0 | 1 |
| MSB | 1 | 1 |
| Program State | P7 | E |

FIG. 13B

Shaping Target Pattern of P_L

Shaping Target Pattern of P_H

| | | |
|---|---|---|
| LSB | 1 | 1 |
| CSB | 0 | 1 |
| MSB | 1 | 1 |
| Program State | P7 | E |

FIG. 14B

Shaping Target Pattern of P_L

Shaping Target Pattern of P_H

| | | |
|---|---|---|
| LSB | 1 | 1 |
| CSB | 0 | 1 |
| MSB | 1 | 1 |
| Program State | P7 | E |

FIG. 14C

| | | MC1 | MC2 | MC3 | MC4 | MC5 | MC6 | MC7 | MC8 |
|---|---|---|---|---|---|---|---|---|---|
| WLn+1 | LSB | 1 | 0 | 0 | 0 | 0 | 0 | 0 | 1 |
| | CSB | 1 | 1 | 1 | 0 | 1 | 1 | 1 | 1 |
| | MSB | 1 | 0 | 1 | 0 | 0 | 1 | 0 | 0 |
| | Program State | E | P4 | P1 | P3 | P4 | P1 | P4 | P5 |

[program status of encoding data ]

STORAGE DEVICE WITH STATE SHAPING AND METHOD OF OPERATING THE SAME

CROSS-REFERENCE TO RELATED APPLICATIONS

This application claims benefit of priority under 35 U.S.C. § 119 to Korean Patent Application No. 10-2023-0088659, filed on Jul. 7, 2023, in the Korean Intellectual Property Office, the disclosure of which is incorporated by reference herein in its entirety.

BACKGROUND

The present disclosure relates generally memory devices, and more particularly, to a storage device and a method of operating the same.

Semiconductor memory devices may be classified into volatile memory devices and nonvolatile memory devices. A flash memory device may be a representative example of nonvolatile memory devices. In the case of a flash memory device storing multibit data in a single memory cell, an appropriate threshold voltage distribution may need to be maintained for data reliability. However, as the degree of integration of memory increases, a threshold voltage distribution of memory cells may be changed due to wordline interference of adjacent memory cells.

SUMMARY

One or more example embodiments of the present disclosure provide a storage device, which may encode data to be programmed in a target wordline in consideration of a program state of an adjacent wordline to improve reliability of the data, and a method of operating the same.

According to an aspect of the present disclosure, a storage device includes a nonvolatile memory device including a plurality of first memory cells coupled to a first wordline and a plurality of second memory cells coupled to a second wordline, the first wordline and the second wordline being adjacent to each other, and a storage controller configured to control the nonvolatile memory device. The storage controller is further configured to encode data to be programmed into the plurality of second memory cells, based on a program state of each of the plurality of first memory cells, the program state including a first state and a second state, and encode the data to be programmed into the second wordline such that a first portion of the data to be written into a first portion of the plurality of second memory cells satisfies a first condition, and a second portion of the data to be written into a second portion of the plurality of second memory cells satisfies a second condition, the first portion of the plurality of second memory cells being adjacent to a first portion of the plurality of first memory cells in the first state, and the second portion of the plurality of second memory cells being adjacent to a second portion of the plurality of first memory cells in the second state.

According to an aspect of the present disclosure, a method of operating a storage device includes checking whether a program state of each of a plurality of first memory cells, connected to a first wordline, is at least one of a first state and a second state, and encoding data to be programmed into a plurality of second memory cells, connected to a second wordline, based on the program state of each of the plurality of first memory cells. The first wordline and the second wordline are adjacent to each other. The encoding of the data to be programmed into the plurality of second memory cells includes encoding the data to be programmed into the second wordline such that a first portion of the data to be written into a first portion of the plurality of second memory cells satisfies a first condition, and a second portion of the data to be written into a second portion of the plurality of second memory cells satisfies a second condition.

According to an aspect of the present disclosure, a method of operating a storage device includes categorizing a program state of each of a plurality of first memory cells, connected to a first wordline, as a plurality of states, encoding data to be programmed into a plurality of second memory cells, connected to a second wordline, based on the program state of each of the plurality of first memory cells, and programming encoded program data into the plurality of second memory cells. The encoding of the data to be programmed into the plurality of second memory cells includes encoding the data to be programmed into the plurality of second memory cells such that a first portion of the data to be written into a first portion of the plurality of second memory cells adjacent to first memory cells in a first state, from among the plurality of states, satisfies a first condition, and a second portion of the data to be written into a second portion of the plurality of second memory cells adjacent to first memory cells in a second state, from among the plurality of states, satisfies a second condition.

Additional aspects may be set forth in part in the description which follows and, in part, may be apparent from the description, and/or may be learned by practice of the presented embodiments.

BRIEF DESCRIPTION OF DRAWINGS

The above and other aspects, features, and advantages of certain embodiments of the present disclosure may be more clearly apparent from the following description taken in conjunction with the accompanying drawings, in which:

FIG. 11A is a diagram illustrating a portion of data programmed in an n-th wordline, which is an adjacent wordline in a TLC cell, and a program state corresponding thereto, according to an embodiment;

FIG. 11B is a diagram illustrating program pattern information for each neighboring cell illustrated in FIG. 11A, according to an embodiment;

FIG. 11C is a diagram illustrating a portion of user data to be programmed into an (n+1)-th wordline, which is a program target wordline, and a program state corresponding thereto, according to an embodiment;

FIGS. 12A to 12C are diagrams illustrating the encoding of data of a first logical page, one of multiple pieces of data to be programmed into the (n+1)-th wordline illustrated in FIG. 11C, according to an embodiment;

FIGS. 13A and 13B are diagrams illustrating the encoding of data of a second logical page, one of multiple pieces of data to be programmed into the (n+1)-th wordline illustrated in FIG. 11C, according to an embodiment;

FIGS. 14A to 14C are diagrams illustrating the encoding of data of a third logical page, one of multiple pieces of data to be programmed into the (n+1)-th wordline illustrated in FIG. 11C, according to an embodiment.

DETAILED DESCRIPTION

Figure 1:
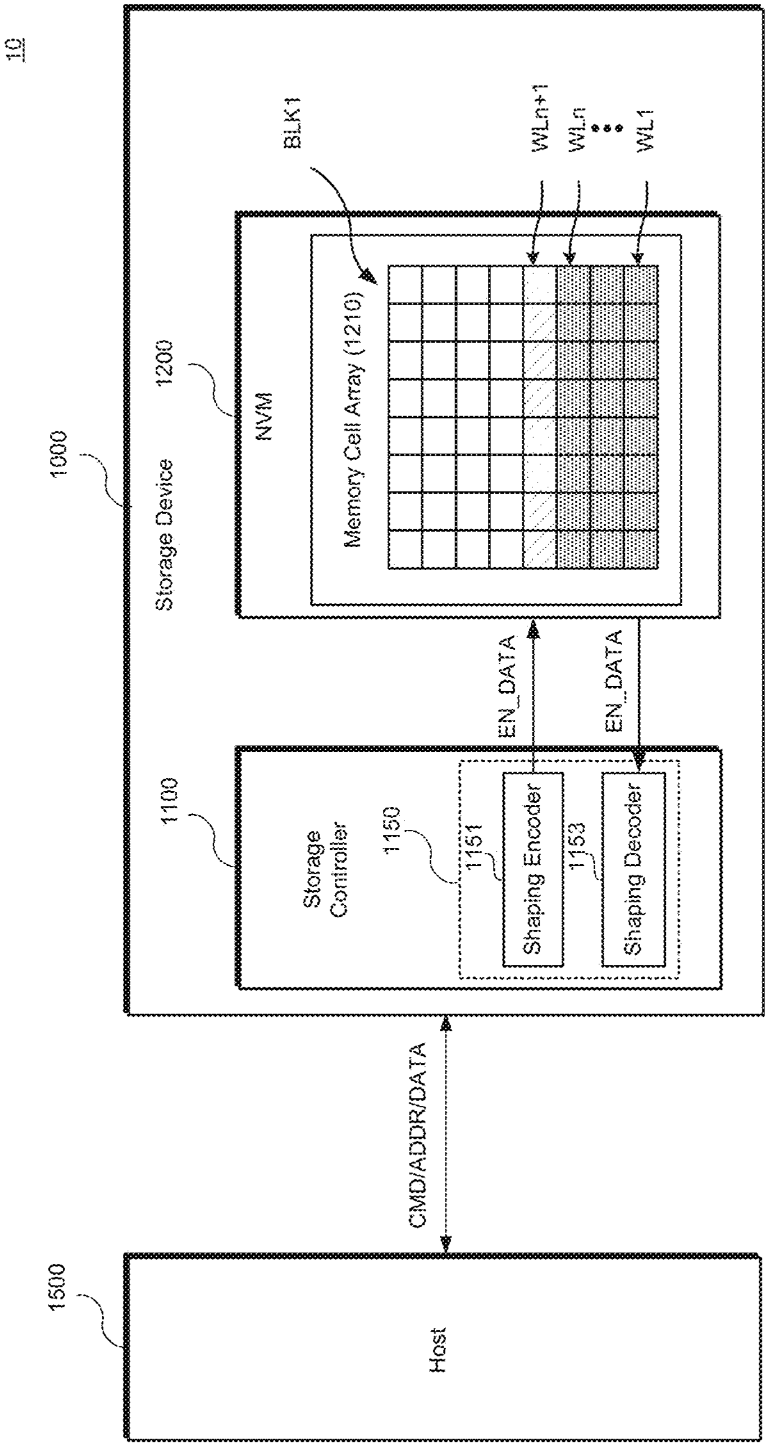
FIG. 1 (RELATED ART)
FIG. 1 is a block diagram illustrating a storage system, according to an example embodiment.

The following description with reference to the accompanying drawings is provided to assist in a comprehensive understanding of embodiments of the present disclosure defined by the claims and their equivalents. Various specific details are included to assist in understanding, but these details are considered to be exemplary only. Therefore, those of ordinary skill in the art may recognize that various changes and modifications of the embodiments described herein may be made without departing from the scope and spirit of the disclosure. In addition, descriptions of well-known functions and structures are omitted for clarity and conciseness.

With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as “A or B,” “at least one of A and B,” “at least one of A or B,” “A, B, or C,” “at least one of A, B, and C,” and “at least one of A, B, or C,” may include any possible combinations of the items enumerated together in a corresponding one of the phrases. As used herein, such terms as “1st” and “2nd,” or “first” and “second” may be used to simply distinguish a corresponding component from another, and does not limit the components in other aspect (e.g., importance or order). It is to be understood that if an element (e.g., a first element) is referred to, with or without the term “operatively” or “communicatively”, as “coupled with,” “coupled to,” “connected with,” or “connected to” another element (e.g., a second element), it means that the element may be coupled with the other element directly (e.g., wired), wirelessly, or via a third element.

Reference throughout the present disclosure to “one embodiment,” “an embodiment,” “an example embodiment,” or similar language may indicate that a particular feature, structure, or characteristic described in connection with the indicated embodiment is included in at least one embodiment of the present solution. Thus, the phrases “in one embodiment”, “in an embodiment,” “in an example embodiment,” and similar language throughout this disclosure may, but do not necessarily, all refer to the same embodiment.

It is to be understood that the specific order or hierarchy of blocks in the processes/flowcharts disclosed are an illustration of exemplary approaches. Based upon design preferences, it is understood that the specific order or hierarchy of blocks in the processes/flowcharts may be rearranged. Further, some blocks may be combined or omitted. The accompanying claims present elements of the various blocks in a sample order, and are not meant to be limited to the specific order or hierarchy presented.

The embodiments herein may be described and illustrated in terms of blocks, as shown in the drawings, which carry out a described function or functions. These blocks, which may be referred to herein as units or modules or the like, or by names such as device, logic, circuit, controller (e.g., storage controller), counter, comparator, generator, converter, or the like, may be physically implemented by analog and/or digital circuits including one or more of a logic gate, an integrated circuit, a microprocessor, a microcontroller, a memory circuit, a passive electronic component, an active electronic component, an optical component, and the like.

Hereinafter, example embodiments are described with reference to the accompanying drawings.

FIG. 1 is a block diagram illustrating a storage system 10, according to an example embodiment.

Referring to FIG. 1, a storage system 10, according to an example embodiment, may include a host 1500 and a storage device 1000.

The host 1500 may write data in the storage device 1000 and/or read data stored in the storage device 1000. To this end, the host 1500 may transmit a command CMD, an address ADDR, and user data DATA to the storage device 1000.

The storage device 1000 may be provided as a data storage of the host 1500. The storage device 1000 may include a storage controller 1100 and a nonvolatile memory device 1200.

The storage controller 1100 may control the overall operation of the storage device 1000. For example, the storage controller 1100 may control the nonvolatile memory device 1200 to perform a program operation, a read operation, or the like, based on the command CMD, the address ADDR, and the user data DATA received from the host 1500.

The nonvolatile memory device 1200 may be and/or may include, but not be limited to, a flash memory, a magnetic random access memory (MRAM), a phase-change random access memory (PRAM), a ferroelectric random access memory (FeRAM), a resistive RAM (ReRAM), and the like. However, the present disclosure is not limited in this regard. That is, the NAND flash memory device described with reference to FIG. 1 is only an example, and other examples are possible.

The nonvolatile memory device 1200 may include a memory cell array 1210. The memory cell array 1210 may include a plurality of memory blocks. In FIG. 1, a single memory block BLK1 is illustrated for ease of description. However, it is to be understood that the memory cell array 1210 may include additional memory blocks.

The memory block BLK1 may include a plurality of memory cells connected to each of a plurality of wordlines (e.g., first wordline WL1 to n-th wordline WLn, and (n+1)-th wordline WLn+1, where n is a positive integer greater than zero (0)). During a program operation, user data DATA may be stored in the plurality of memory cells connected to each of the plurality of wordlines. In an example embodiment, the program operation may be sequentially performed from the first wordline WL1 to the (n+1)-th wordline WLn+1. However, this is merely exemplary and a direction, in which the program operation is performed, may vary according to example embodiments.

In an example embodiment, during a program operation, the storage controller 1100 may encode user data DATA, provided from the host 1500, to have different data conditions depending on a program state of an adjacent wordline. The encoded data EN_DATA may be transmitted to the nonvolatile memory device 1200 and then programmed into a plurality of memory cells.

In an example embodiment, during a read operation, the storage controller 1100 may read the encoded data EN_DATA from the nonvolatile memory device 1200. The storage controller 1100 may decode the encoded data EN_DATA into original user data DATA, and may transmit the decoded data to the host 1500.

In an embodiment, the storage controller 1100 may include a state shaping circuit 1150. The state shaping circuit 1150 may include a shaping encoder 1151 and a shaping decoder 1153.

For ease of description, an example is provided in which a program operation is sequentially performed from the first wordline WL1 to the (n+1)-th wordline WLn+1 in the memory block BLK1 of FIG. 1. Also, an example is provided in which the first to n-th wordlines WL1 to WLn are in a programmed state, and a program operation is to be performed on the (n+1)-th wordline WLn+1. Additionally, an example is provided in which the (n+1)-th wordline WLn+1 is a target wordline.

In an embodiment, the shaping encoder 1151 may encode data to be programmed into memory cells (hereinafter referred to as "target cells") connected to the (n+1)-th wordline WLn+1 (e.g., a target wordline) based on a program state of memory cells (hereinafter referred to as "adjacent cells") connected to the n-th wordline WLn adjacent to the target wordline.

In an example embodiment, the shaping encoder 1151 may encode data to be programmed into target cells, based on a program state of an adjacent cell corresponding to each of the target cells.

For example, the shaping encoder 1151 may determine whether a program state of each of the adjacent cells is a first state P_L or a second state P_H. The first state P_L may include at least one program state corresponding to a relatively low threshold voltage, among program states of the memory cell. The second state PH may include at least one program state corresponding to a relatively high threshold voltage, among the program states of the memory cell.

The shaping encoder 1151 may encode data to be programmed into target cells such that data satisfying the first data condition may be programmed into a target cell corresponding to the adjacent cell in the first state P_L, and data satisfying the second data condition may be programmed into the target cell corresponding to the adjacent cell in the second state P_H.

The first data condition may be a data condition for data to be programmed in a target cell, corresponding to an adjacent cell in the first state P_L, to have a program pattern excluding the first shaping target pattern. The second data condition may be a data condition for data to be programmed into a target cell, corresponding to an adjacent cell in the second state P_H, to have a program pattern excluding the second shaping target pattern.

For example, the first shaping target pattern may be a program state corresponding to a highest (e.g., maximum) threshold voltage, from among program states of a memory cell. The second shaping target pattern may be a program state corresponding to a lowest (e.g., minimum) threshold voltage, from among the program states of a memory cell. However, the present disclosure is not limited in this regard, and the first shaping target pattern and the second shaping target pattern may be set to vary according to example embodiments. For example, the first shaping target pattern may be a program state corresponding to a next highest threshold voltage, from among the program states of a memory cell, and the second shaping target pattern may be a program state corresponding to a next lowest threshold voltage, from among the program states of a memory cell.

According to an example embodiment, the shaping encoder 1151 may transmit encoding-related information, used when the encoded data EN_DATA is generated, to the nonvolatile memory device 1200.

The shaping decoder 1153 may receive the encoded data EN_DATA from the nonvolatile memory device 1200. The shaping decoder 1153 may decode original user data DATA from the encoded data EN_DATA using the encoding-related information.

As described above, the storage device 1000, according to an example embodiment, may encode data to be programmed into a target wordline to have different data conditions depending on a program state of an adjacent wordline. For example, the storage device 1000 may encode data to be programmed into target cells such that data satisfying the first data condition may be programmed into a target cell corresponding to an adjacent cell in a first state P_L, and data satisfying the second data condition may be programmed into a target cell corresponding to an adjacent cell in a second state P_H. Accordingly, interference between wordlines may be reduced during a program operation, resulting in improved reliability of data.

Figure 2:
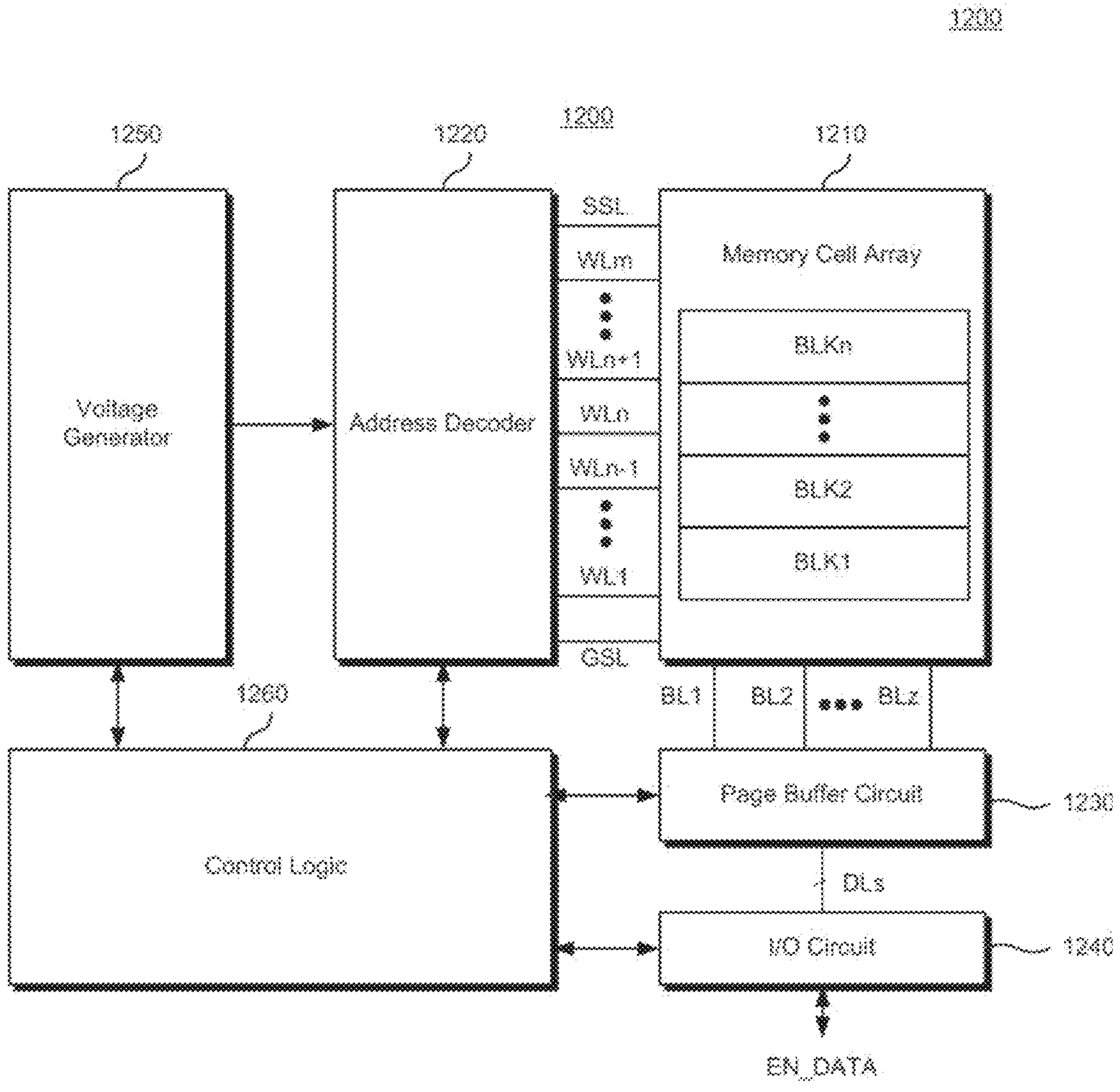
FIG. 2 (RELATED ART)
FIG. 2 is a block diagram illustrating the nonvolatile memory device illustrated in FIG. 1, according to an embodiment.

FIG. 2 is a block diagram illustrating the nonvolatile memory device 1200 illustrated in FIG. 1, according to an embodiment. Referring to FIG. 2, the nonvolatile memory device 1200 may include a memory cell array 1210, an address decoder 1220, a page buffer circuit 1230, a data input/output (I/O) circuit 1240, a voltage generator 1250, and a control logic 1260.

The memory cell array 1210 may include a plurality of memory blocks (e.g., first memory block BLK1, second memory block BLK2, to n-th memory block BLKn). Each memory block may include a plurality of memory cells connected to a plurality of wordlines. In an embodiment, memory cells, connected to the same wordline, may constitute a single physical page. When multibit data is stored in each memory cell, each wordline may include a plurality of logical pages.

Each memory block (e.g., BLK1) may be connected to a string select line SSL, a plurality of wordlines (e.g., first wordline WL1 to (n−1)-th wordline WLn−1, n-th wordline WLn, and (n+1)-th wordline WLn+1, to m-th wordline WLm, where m is a positive integer greater than n), and a ground select line GSL.

The address decoder 1220 may be connected to the memory cell array 1210 through the select lines SSL and GSL and the plurality of wordlines WL1 to WLm. The address decoder 1220 may select a wordline during a program and/or a read operation. The address decoder 1220 may receive a wordline voltage from the voltage generator 1250, and may provide a program voltage and/or a read voltage to a selected wordline.

The page buffer circuit 1230 may be connected to the memory cell array 1210 through bitlines (e.g., first bitline BL1, second bitline BL2, to z-th bitline BLz, where z is a positive integer greater than zero (0)). The page buffer circuit 1230 may temporarily store data to be stored in the memory cell array 1210 and/or data read from the memory cell array 1210.

The I/O circuit 1240 may be internally connected to the page buffer circuit 1230 through a data line, and may be externally connected to a storage controller (e.g., storage controller 1100 of FIG. 1) through an input/output line.

In an example embodiment, the I/O circuit 1240 may receive the encoded data EN_DATA from the storage controller 1100 during a program operation. In such an example, the I/O circuit 1240 may also receive the encoding-related information used when the encoded data EN_DATA is generated. Alternatively or additionally, the I/O circuit 1240 may provide the encoded data EN_DATA, read from the memory cell array 1210, to the storage controller 1100 during a read operation. In such an example, the I/O circuit 1240 may also provide the encoding-related information, read from the memory cell array 1210, to the storage controller 1100. The encoding-related information may be information on an encoding code used when the encoded data EN_DATA is generated.

The voltage generator 1250 may generate wordline voltages needed to read and/or write data and a voltage to be provided to a bulk in which memory cells are formed, under the control of the control logic 1260. The voltage generator 1250 may generate a select line voltage provided to the select lines SSL and GSL during a read operation and/or a program operation.

Figure 3:
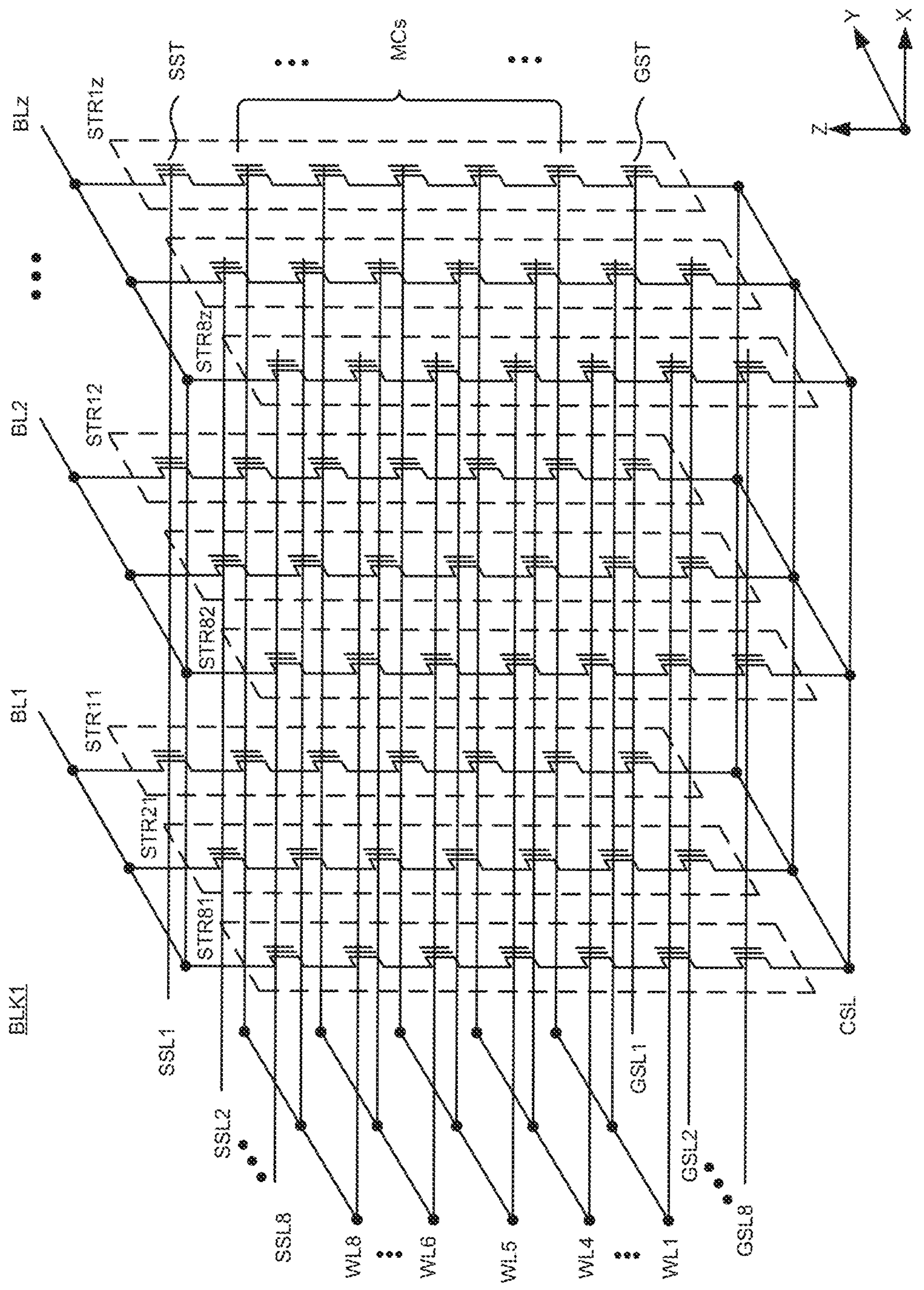
FIG. 3 (RELATED ART)
FIG. 3 is a circuit diagram illustrating a memory block of a memory cell array illustrated in FIG. 2, according to an embodiment.

FIG. 3 is a circuit diagram illustrating a memory block BLK1 of the memory cell array illustrated in FIG. 2, according to an embodiment. Referring to FIG. 3, the memory block BLK1 may include eleventh to eighth cell strings STR11 to STR8*z* between first to z-th bitlines BL1 to BLz and a common source line CSL. In an example embodiment, the eleventh to 8z-th cell strings STR11 to STR8*z* may be formed in a direction perpendicular to a substrate (e.g., z direction).

Each cell string may include a string select transistor SST, a plurality of memory cells MCs, and a ground select transistor GST.

String select transistors SST may be connected to first to eighth string select lines SSL1 to SSL8, respectively. Ground select transistors GST may be connected to first to eighth ground select lines GSL1 to GSL8, respectively. The string select transistors SST may be connected to first to z-th bitlines BL1 to BLz. The ground select transistors GST may be connected to the common source line CSL.

A first wordline WL1 may be disposed on the first to eighth ground select lines GSL1 to GSL8. Memory cells MCs, disposed at the same height from the substrate, may be connected to the first wordline WL1. Similarly, the memory cells, disposed at the same height from the substrate, may be connected to each of second to eighth wordlines WL2 to WL8.

Figure 4:
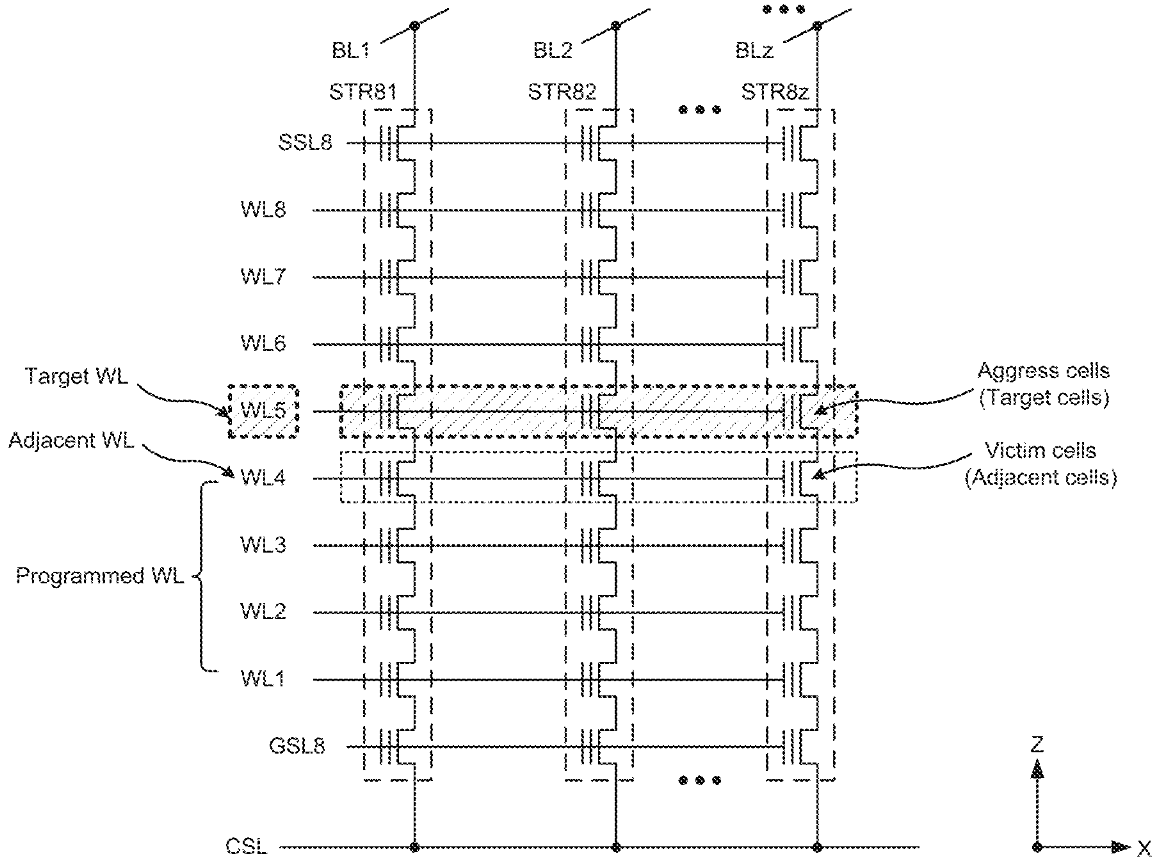
FIG. 4 is a circuit diagram illustrating cell strings selected by an eighth string select line from among cell strings of the memory block illustrated in FIG. 3, according to an embodiment.
Figure 5:
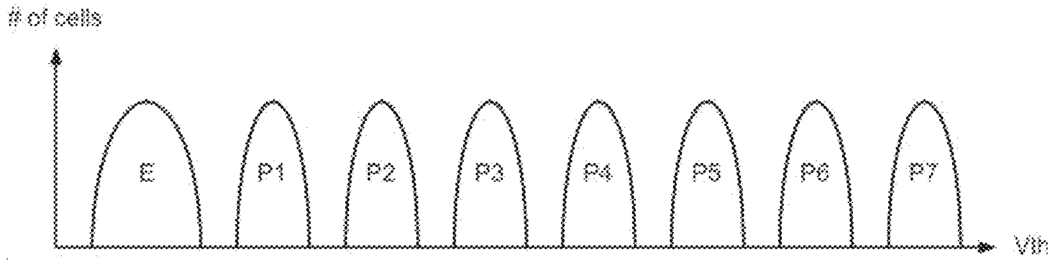
FIG. 5 (RELATED ART)
FIG. 5 is a diagram illustrating an example of a threshold voltage distribution depending on a program state of a memory cell, according to an embodiment.

FIG. 4 is a circuit diagram illustrating cell strings, selected by an eighth string select line SSL8, from among cell strings of the memory block BLK1 illustrated in FIG. 3, according to an embodiment. FIG. 5 is a diagram illustrating an example of a threshold voltage distribution depending on a program state of a memory cell, according to an embodiment. For ease of description, an example is provided in which the first to fourth wordlines WL1 to WL4 are wordlines, on which a program operation has been completed, and the fifth wordline WL5 is a target wordline on which a program operation is to be performed.

Referring to FIG. 4, 81st to 8z-th cell strings STR81 to STR8*z* may be selected by the eighth string select line SSL8. The 81st to 8z-th cell strings STR81 to STR8*z* may be connected to first to z-th bitlines BL1 to BLz, respectively. Memory cells, selected by a single string select line and connected to a single wordline, may constitute a single physical page.

Multibit data may be stored in each memory cell. As used herein, a plurality of logical pages may correspond to a single wordline. For example, when the number of bits stored in each memory cell is "a", a single wordline may have "a" logical pages, where "a" is a positive integer greater than zero (0).

For example, each memory cell may be a triple level cell (TLC) storing three (3) bits of data (e.g., a=3). In such an example, a single wordline may have three (3) logical pages. In addition, each memory cell storing three (3) bits of data may have a threshold voltage corresponding to one of an erase state E and seven (seven) program states (e.g., first program state P1, second program state P2, third program state P3, fourth program state P4, fifth program state P5, sixth program state P6, seventh program state P7), as shown in FIG. 5.

In the case of TLC, after the program operation is completed, memory cells connected to the fourth wordline WL4 may have a threshold voltage distribution as shown in FIG. 5. However, when a program operation is performed on the fifth wordline WL5, a target wordline, a threshold voltage distribution of memory cells connected to the fourth wordline WL4, an adjacent wordline, may be affected.

As used herein, memory cells connected to the fourth wordline WL4 may be referred to as "victim cells," and memory cells connected to the fifth wordline WL5 may be referred to as "aggress cells." The aggress cells may refer to cells having an influence on other cells, and the victim cells may refer to cells affected by the aggress cells. Threshold voltages of the victim cells may be shifted from original programmed threshold voltages due to lateral charge spreading and wordline (WL) interference caused by physical influences of the aggress cells.

Such a change in threshold voltage may be significant when a program state of a victim cell is an upper program state and a program state of an aggress cell is a lower program state and/or when a program state of a victim cell is a lower program state and a program state of an adjacent aggress cell is the lower program state.

The storage device 1000, according to an example embodiment, may encode data to be programmed into the fifth wordline WL5, a target wordline, based on a program state of the fourth wordline WL4, an adjacent wordline, to prevent such a change in threshold voltage of victim cells. In such an embodiment, the encoding operation may be performed to reduce a difference between threshold voltages of the victim cells and the aggress cells.

For example, the storage device 1000 may assign the victim cells to a first state P_L and/or a second state P_H based on a program state of the victim cells. The storage device 1000 may encode data to be programmed into the aggress cells such that data satisfying a first data condition is programmed into an aggress cell corresponding to a victim cell in the first state P_L, and data satisfying a second data condition is programmed into a target cell corresponding to a victim cell in the second state P_H. Accordingly, a change in threshold voltages of victim cells may be reduced during a program operation, thereby resulting in potentially improved reliability of data.

Figure 6:
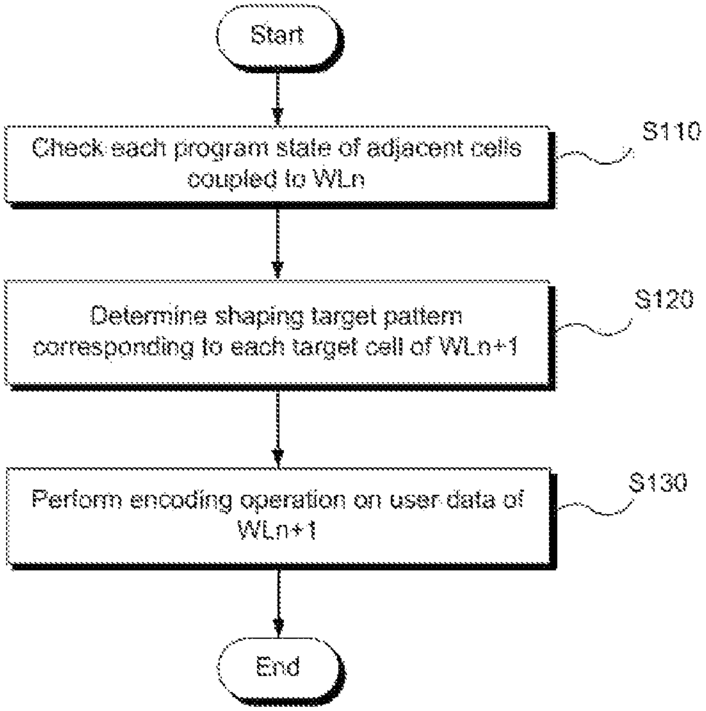
FIG. 6 is a flowchart illustrating a method of operating a storage controller, according to an example embodiment.
Figure 7A:
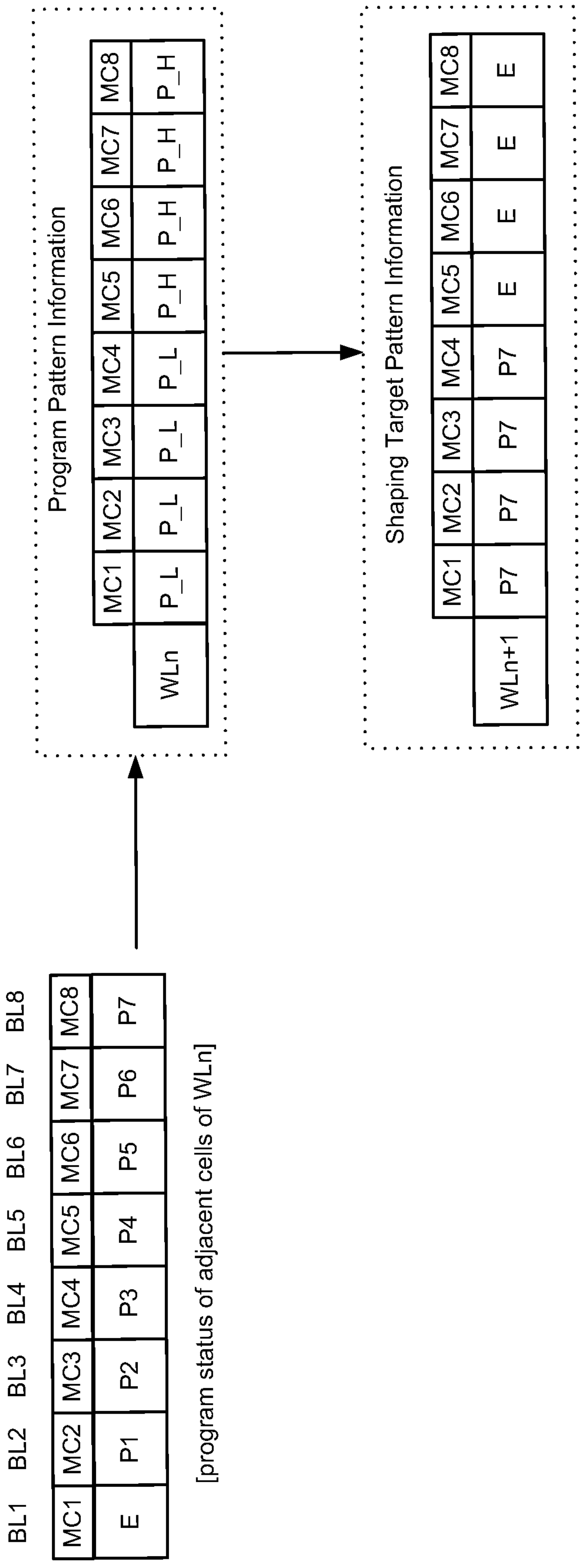
FIGS. 7A and 7B are diagrams illustrating an example of operations S110 to S130 illustrated in FIG. 6, according to an embodiment.
Figure 7B:
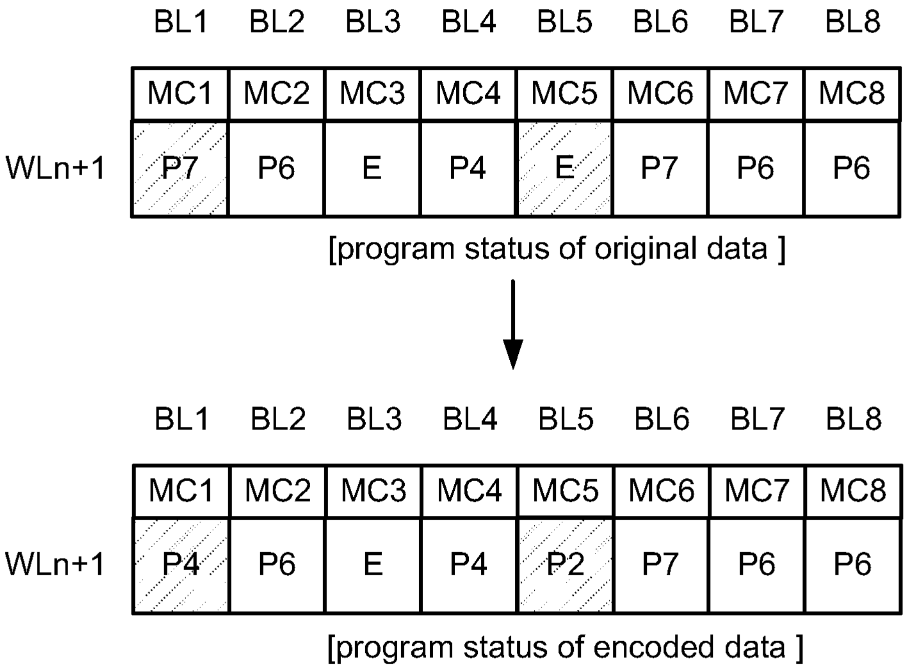

FIG. 6 is a flowchart illustrating a method of operating the storage controller 1100, according to an example embodiment. FIGS. 7A and 7B are diagrams illustrating an example of operations S110 to S130 illustrated in FIG. 6, according to an embodiment.

For ease of description, an example is provided in which a target wordline is an (n+1)-th wordline WLn+1 and an adjacent wordline is an n-th wordline WLn.

In operation S110, the storage controller 1100 may check a program state of each of adjacent cells connected to the n-th wordline WLn, the adjacent wordline.

For example, FIG. 7A illustrates memory cells (e.g., first memory cell MC1, second memory cell MC2, third memory cell MC3, fourth memory cell MC4, fifth memory cell MC5, sixth memory cell MC6, seventh memory cell MC7, and eighth memory cell MC8) corresponding to first to eighth bitlines BL1 to BL8, among the memory cells connected to the nth wordline WLn. For example, the memory cells MC1 to MC8 may be triple level cells (TLCs). In such an example, a program state of each memory cell may correspond to one of an erase state E and first to seventh program states P1 to P7. For ease of description, an example is provided in which first to eighth memory cells MC1 to MC8 connected to the n-th wordline WLn, adjacent wordlines, are programmed to states E, P1, P2, P3, P4, P5, P6 and P7, respectively.

In an example embodiment, the storage controller 1100 may check the program state of each of the memory cells MC1 to MC8 connected to the n-th wordline WLn, and may categorize the program state of each cell as a first state P_L and a second state P_H. The first state P_L may be a program state corresponding to a low threshold voltage, from among the program states of the memory cells, and the second state P_H may be a program state corresponding to a high threshold voltage, from among the program states of the memory cells.

In an example embodiment, when the number of bits stored in a memory cell is "a", an erase state and states P1 to P$2^{a-1}$-1 may each be the first state P_L, and states P$2^{a-1}$ to P$2^{a}$-1 may each be the second state P_H.

For example, as shown in FIG. 7A, the storage controller 1100 may check a program state of each memory cell, and may categorize each of the states E, P1, P2, and P3 as the first state P_L and categorize each of the states P4, P5, P6, and P7 as the second state P_H. In such an example, the storage controller 1100 may generate program pattern information based on whether the program state of each memory cell is the first state P_L and/or the second state P_H.

In operation S120, the storage controller 1100 may determine a shaping target pattern for each target cell connected to the (n+1)-th wordline WLn+1 (e.g., a target wordline).

For example, the storage controller 1100 may determine that among the target cells, target cells corresponding to adjacent cells having the first state P_L as a program state have a first shaping target pattern. Alternatively or additionally, the storage controller 1100 may determine that among the target cells, target cells corresponding to adjacent cells having the second state P_H as a program state have a second shaping target pattern In an example embodiment, the first shaping target pattern may be a program state corresponding to a highest (e.g., maximum) threshold voltage, from among program states of each memory cell, and the second shaping target pattern may be a program state corresponding to an erase state, from among the program states of the memory cells. However, this is merely exemplary, and example embodiments are not limited thereto. As another example, the first shaping target pattern may be in a program state corresponding to a next highest threshold voltage, and the second shaping target pattern may be in a program state corresponding to a next lowest threshold voltage. The first shaping target pattern corresponding to the first state and the second shaping target pattern corresponding to the second state may be predetermined when the storage device 1000 is designed. Alternatively or additionally, the first shaping target pattern and the second shaping target pattern may be updated by the storage controller 1100 based on data environments with the host 1500 and other characteristics.

For example, referring to FIG. 7A, the storage controller 1100 may determine the state P7 as a shaping target pattern for the target cells MC1, MC2, MC3, and MC4 corresponding to an adjacent cell having the first state P_L as a program state. The storage controller 1100 may determine the erase state as a shaping target pattern for the target cells MC5, MC6, MC7, and MC8 having the second state PH as a program state. The storage controller 1100 may generate target pattern information based on the determined shaping target pattern.

In operation S130, the storage controller 1100 may encode user data to be programmed into the (n+1)-th wordline WLn+1 (e.g., the target wordline).

For example, the storage controller 1100 may encode user data to be programmed into the (n+1)-th wordline WLn+1, based on the first data condition and the second data condition.

In an example embodiment, the storage controller 1100 may encode user data to be programmed to satisfy the first data condition or the second data condition based on a state of the adjacent cell. For example, data to be programmed into target cells corresponding to adjacent cells in the first state P_L may be encoded to satisfy the first data condition. Data to be programmed into target cells corresponding to adjacent cells in the second state PH may be encoded to satisfy the second data condition.

The first data condition may be a data condition preventing target cells corresponding to an adjacent cell in the first state P_L from having a first shaping target pattern. The second data condition may be a data condition preventing target cells corresponding to an adjacent cell in the second state P_H from having a second shaping target pattern.

That is, as shown in the example embodiment of FIG. 7A, when the first shaping target pattern is in the state P7, the first data condition may be a data condition causing the program pattern corresponding to data after encoding to have a program pattern, other than the state P7. For example, when the program data corresponding to the state P7 is "[011]", the first data condition may be a data condition preventing data after encoding from being "[011]".

For example, when the second shaping target pattern is in the erase state E, the second data condition may be a data condition preventing a program pattern corresponding to data after encoding from having the erase state E. For example, when a program data corresponding to the erase state is "[111]", the second data condition may be a data condition preventing data after encoding from being "[111] ".

In an example embodiment, the storage controller 1100 may use a plurality of codewords when user data to be programmed into a target wordline is encoded. The storage controller 1100 may provide encoded data applied with a codeword, satisfying the first and second data conditions to the greatest extent (e.g., maximized), among the plurality of codewords, as an encoding result value. In an example embodiment, the plurality of codewords may be polar coded codes.

FIG. 7B illustrates a program state corresponding to user data to be programmed into the (n+1)-th wordline WLn+1 (e.g., unencoded original data) and a program state corresponding to encoded data after encoding, according to an embodiment.

Referring to the state of data to be programmed into the (n+1)-th wordline WLn+1 corresponding to the unencoded original data, data to be programmed into a target cell MC1 connected to a first bitline BL1 may have a state P7, and data to be programmed into a target cell MC5 connected to a fifth bitline BL5 may have a state E.

The data to be programmed into the target cell MC1 connected to the first bitline BL1 may be data corresponding to a first shaping target pattern because a corresponding adjacent cell has a first state P_L. Accordingly, the data to be programmed into the target cell MC1 may be encoded to satisfy the first data condition which does not have the first shaping target pattern (e.g., the state P7).

The data to be programmed into the target cell MC5 connected to the fifth bitline BL5 may be data corresponding to a second shaping target pattern because a corresponding adjacent cell has a second state P_H. Accordingly, the data to be programmed into the target cell MC5 may be encoded to satisfy the second data condition which does not have the second shaping target pattern (e.g., the state E).

Data to be programmed into target cells MC3 and MC6 connected to a third bitline BL3 and a sixth bitline BL6 may have the state E and the state P7, respectively. However, corresponding adjacent cells are in the first state P_L and the second state P_H, so that a program pattern of data to be programmed into the target cells MC3 and MC6 connected to the third bitline BL3 and the sixth bitline BL6 may not be a shaping target pattern.

As a result, referring to program states of the target cells corresponding to the encoded data after an encoding operation, the target cell MC1 connected to the first bitline BL1 may have a program pattern (e.g., P4) other than the first shaping target pattern and the target cell MC5 connected to the fifth bitline BL5 may have a program pattern (e.g., P2) other than the second shape target pattern, as shown in FIG. 7B.

In an example embodiment, target cells corresponding to adjacent cells having the first state P_L as a program state may not have a first shaping target pattern, and target cells corresponding to adjacent cells having the second state P_H as a program state may not have a second shaping target pattern.

Alternatively or additionally, the number of target cells having a first shaping target pattern, from among target cells corresponding to adjacent cells having a first state P_L as a program state, may be decreased and the number of target cells having a second shaping target pattern, from among target cells corresponding to adjacent cells having a second state P_H as a program state, may be decreased. Accordingly, a change in threshold voltage distribution caused by wordline interference and lateral charge loss may be reduced, potentially resulting in improved reliability of data.

For ease of description, in FIGS. 7A and 7B, adjacent cells have been described as being categorized as two states P_L and P_H, and target cells have been described as corresponding to one of two shaping target patterns. However, this is merely exemplary and example embodiments are not limited thereto. As another example, adjacent cells may be categorized as three or more states, as described with reference to FIG. 8.

Figure 8A:
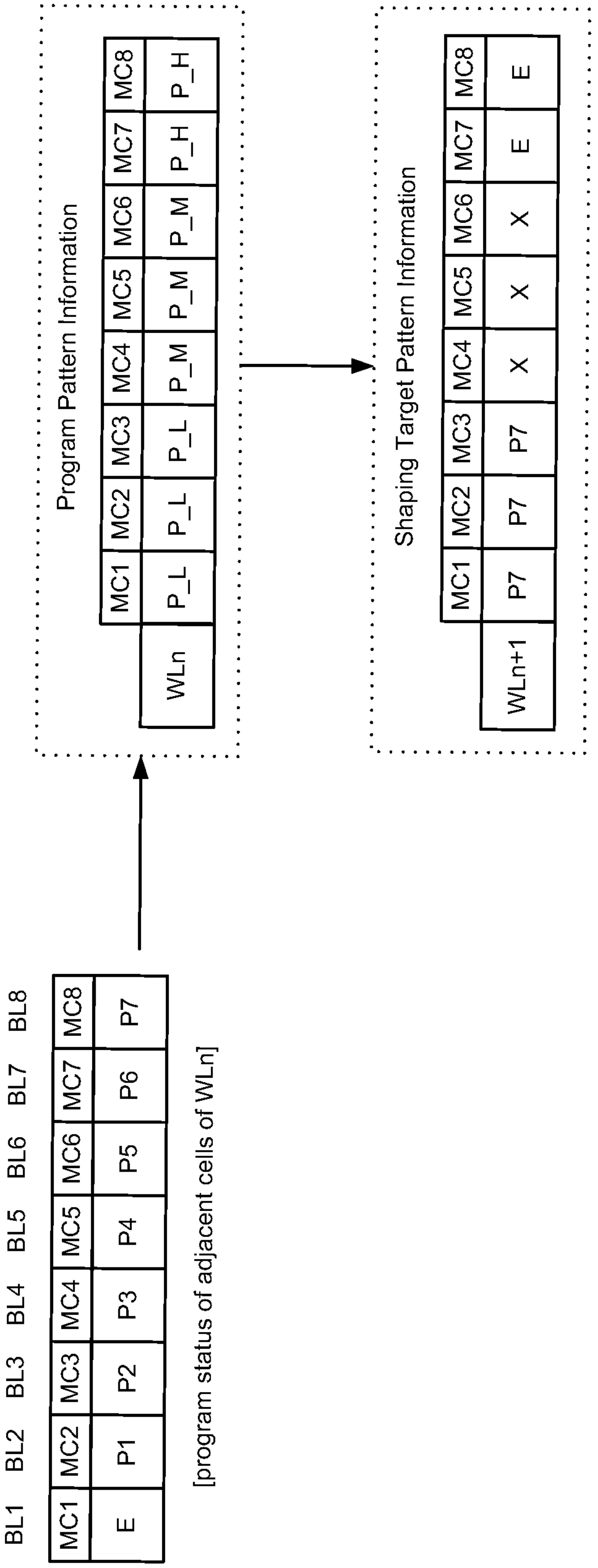
FIGS. 8A and 8B are diagrams illustrating an example of operations S110 to S130 illustrated in FIG. 6, according to an embodiment.
Figure 8B:
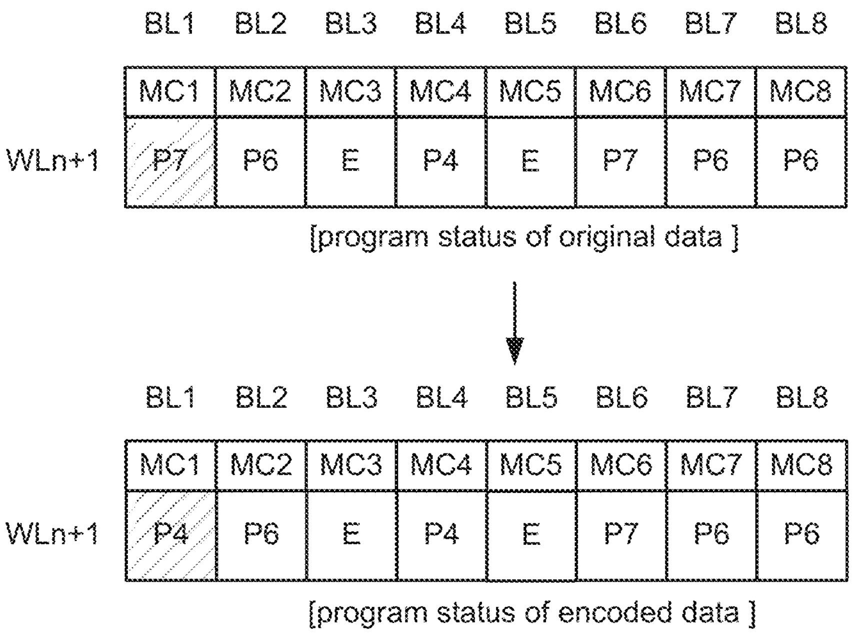

FIGS. 8A and 8B are diagrams illustrating an example of operations S110 to S130 illustrated in FIG. 6, according to an embodiment. FIGS. 8A and 8B may be similar in many respects to FIGS. 7A and 7B, and may include additional features not mentioned above. Consequently, repeated descriptions may be omitted for the sake of brevity.

A storage controller 1100, according to an example embodiment, may categorize adjacent cells as one of three (3) states based on a program state. For example, the storage controller 1100 may identify an adjacent cell corresponding to a first state P_L and an adjacent cell corresponding to a second state P_H based on a program state of each of the adjacent cells. Alternatively or additionally, the storage controller 1100 may categorize adjacent cells, which do not correspond to the first and second states P_L and P_H, as cells corresponding to a third state P_M.

For example, as shown in FIG. 8A, first to third adjacent cells MC1 to MC3, respectively having a state E, a state P1, and a state P2, may be categorized as the first state P_L. Seventh and eighth adjacent cells MC7 and MC8, respectively having a state P6 and a state P7, may be categorized as the second state P_H. Fourth to sixth adjacent cells MC4 to MC6, having remaining program states, may be categorized as the third state P_M. Based thereon, the storage controller 1100 may generate program pattern information as shown in FIG. 8A.

Continuing to refer to FIG. 8A, the target cells MC1 to MC3 corresponding to the adjacent cells MC1 to MC3, having the first state P_L as a program state, may have a first shaping target pattern (e.g., the state P7). The target cells MC7 and MC8 corresponding to adjacent cells MC7 and MC8, having the second state PH as a program state, may have a second shaping target pattern (e.g., the state E). The target cells MC4 to MC6 corresponding to the adjacent cells MC4 to MC6, having the third state P_M as a program state, may not have a shaping target pattern and/or may have a default value. Based thereon, the storage controller 1100 may generate shaping target pattern information as shown in FIG. 8A.

In an embodiment, data to be programmed into target cells may be encoded such that data to be programmed into target cells corresponding to adjacent cells in the first state P_L satisfies a first data condition and data to be programmed into target cells corresponding to adjacent cells in the second state P_H satisfies a second data condition. Alternatively or additionally, data to be programmed into target cells corresponding to adjacent cells in the third state P_M may not be encoded.

Referring to FIG. 8B, data to be programmed into the target cell MC1 connected to the first bitline BL1 may be encoded to satisfy the first data condition. For example, the data to be programmed into the target cell MC1 connected to the first bitline BL1 may be encoded from the state P7 to the state P4. Data to be programmed into the target cell MC5 connected to the fifth bitline BL5 may not be encoded. For example, in FIGS. 7A and 7B, the data to be programmed in the target cell connected to the fifth bitline BL5 is encoded from the state E to the state P2, while in FIGS. 8A and 8B, the data to be programmed into the target cell MC5 connected to the fifth bitline BL5 may be maintained in the state E.

According to the present embodiment, the storage controller 1100 may not set a shaping target pattern and a data condition for target cells corresponding to adjacent cells having neither the first state P_L nor the second states P_H. That is, a change in distribution of a threshold voltage for the adjacent cells having neither the first state nor the second state may be smaller (e.g., less) than a change in distribution of a threshold voltage for the adjacent cells having the first and second states, and as such, setting the shaping target pattern and/or the data condition such target cells may not be needed. Accordingly, the storage controller 1100 may improve the efficiency of the encoding by preventing encoding of at least a portion of the user data.

Figure 9:
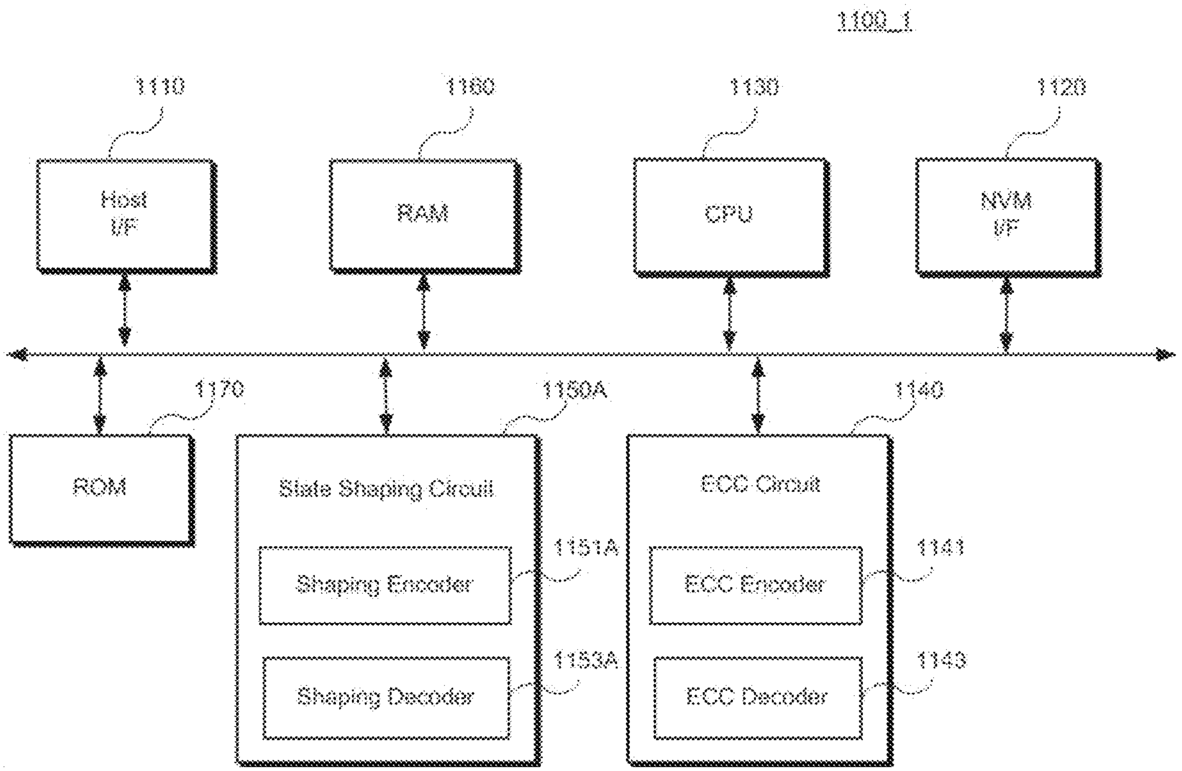
FIG. 9 (RELATED ART)
FIG. 9 is a block diagram illustrating a configuration of a storage controller, according to an example embodiment.

FIG. 9 is a block diagram illustrating a configuration of a storage controller, according to an example embodiment. A storage controller 1100_1 of FIG. 9 may include and/or may be similar in many respects to the storage controller 1100 of FIG. 1, and may include additional features not mentioned above. Consequently, the same or similar components may be denoted by the same and/or similar reference numerals, and repeated descriptions of storage controller 1100_1 may be omitted for the sake of brevity.

Referring to FIG. 9, the storage controller 1100_1 may include a host interface (I/F) 1110, a nonvolatile memory interface 1120, a central processing unit (CPU) 1130, an error correction code (ECC) circuit 1140, a state shaping circuit 1150A, a random access memory (RAM) 1160, and a read-only memory (ROM) 1170.

The host I/F 1110 may perform an interface between the storage device 1000 including a storage controller 1100_1 and a host 1500. The host I/F 1110 may communicate with the host 1500 using at least one protocol such as, but not limited to, universal flash storage (UFS), small computer system interface (SCSI), serial attached SCSI (SAS), serial advanced technology attachment (SATA), peripheral component interconnect express (PCIe), embedded MultiMediaCard (eMMC), fibre channel (FC), advanced technology attachment (ATA), integrated drive electronics (IDE), universal serial bus (USB), Institute of Electrical and Electronics Engineers (IEEE) 1394 (Firewire), and the like.

The nonvolatile memory interface 1120 may perform (e.g., communicate over) an interface between the storage controller 1100_1 and the nonvolatile memory device 1200.

The CPU 1130 may control the overall operation of the storage controller 1100_1. For example, the CPU 1130 may control the state shaping circuit 1150A, the nonvolatile memory interface 1120, and the like, to program data into the nonvolatile memory device 1200 and/or to read data stored in the nonvolatile memory device 1200, in response to a request from the host 1500.

The ECC circuit 1140 may perform error bit correction. For example, the ECC circuit 1140 may perform error detection and correction functions for read data read from the nonvolatile memory device 1200. In an embodiment, the ECC circuit 1140 may include an ECC encoder 1141 and an ECC decoder 1143.

The ECC encoder 1141 may generate parity bits for data to be programmed into the nonvolatile memory device 1200. In an example embodiment, the ECC encoder 1141 may generate parity bits for encoded data encoded by the state shaping circuit 1150A. The generated parity bits may be programmed into the nonvolatile memory device 1200 together with encoded data.

When data is read from the nonvolatile memory device 1200, the ECC decoder 1143 may correct an error in the encoded data using the parity bits read together with the encoded data. The error-corrected encoded data EN_DATA may be provided to the state shaping circuit 1150A.

The ECC encoder 1141 and the ECC decoder 1143 may perform error correction using coded modulation such as, but not limited to, low density parity check (LDPC) code, Bose-Chaudhuri-Hocquenghem (BCH) code, turbo code, Reed-Solomon code, convolution code, recursive systematic code (RSC), trellis-coded modulation (TCM), block coded modulation (BCM), and the like. However, the present disclosure is not limited thereto.

Continuing to refer to FIG. 9, the state shaping circuit 1150A may include a shaping encoder 1151A and a shaping decoder 1153A.

The shaping encoder 1151A may encode data to be programmed into a target wordline based on a programming state of an adjacent wordline. For example, the shaping encoder 1151A may encode data to be programmed into a target wordline based on whether the program state of an adjacent wordline is a first state P_L or a second state P_H. In such an example, data to be programmed into the target cell corresponding to the adjacent cell in the first state P_L may be encoded to satisfy the first data condition. Data to be programmed into the target cell corresponding to the adjacent cell in the second state P_H may be encoded to satisfy the second data condition.

In an example embodiment, the first state P_L may be a program state corresponding to a relatively low threshold voltage from among program states of each memory cell, and the second state PH may be a program state corresponding to a relatively high threshold voltage from among program states of each memory cell. In an example embodiment, the first data condition may be a data condition preventing data to be programmed in a target cell corresponding to an adjacent cell in the first state P_L from having a first shaping target pattern. The second data condition may be a data condition preventing data to be programmed in a target cell corresponding to an adjacent cell in the second state P_H from having a second shaping target pattern. In an example embodiment, the first shaping target pattern may be a program state corresponding to a highest threshold voltage among the program states of the memory cells, and the second shaping target pattern may be a program state corresponding to an erase state among the program states of the memory cells.

The shaping encoder 1151A may use a plurality of codewords when encoding data to be programmed to a target wordline. In an example embodiment, the shaping encoder 1151A may encode data using a polar coded codeword.

In an example embodiment, when data to be programmed into a target wordline includes data of a plurality of logical pages, the shaping encoder 1151A may perform temporary encoding on the data of a plurality of logical pages. The shaping encoder 1151A may perform encoding by sequentially applying a plurality of codewords to temporarily encoded data of each logical page.

The shaping encoder 1151A may select a codeword satisfying the first and second data conditions for each data of each logical page to the greatest extent (e.g., maximized). Data of each logical page, to which the selected codeword is applied, may be output as an encoding result value.

Encoded data, output from the shaping encoder 1151A, may be programmed into the nonvolatile memory device 1200 together with encoding-related information. In an example embodiment, the encoding-related information may be information related to codewords selected for each logical page.

The shaping decoder 1153 may read the encoded data from the nonvolatile memory device 1200, and may decode original data from the encoded data using the encoding related information.

The RAM 1160 may be a cache memory (e.g., static RAM (SRAM)), a buffer memory (e.g., a dynamic RAM (DRAM)), and/or a driving memory. The RAM 1160 may store information necessary for the state shaping circuit 1150A to perform encoding.

The ROM 1170 may store a driving firmware code of the storage device 1000 and codes necessary for an operation of the storage controller 1100.

In an embodiment, the storage controller 1100_1 may encode data to be programmed into a target wordline to have data conditions varying depending on a program state of an adjacent wordline. In addition, when the data to be programmed is data for a plurality of logical pages, the storage controller 1100_1 may temporarily encode the data of the plurality of logical pages and may sequentially apply codewords to the temporarily encoded data of the plurality of logical pages. In such an embodiment, a codeword satisfying the first and second data conditions to the greatest extent (e.g., maximized) may be selected for each logical page. The storage controller 1100_1 may output data of each logical page, to which the selected codeword is applied, as an encoding result value. Accordingly, interference between wordlines during a program operation may be reduced, resulting in improved reliability of data.

Figure 10:
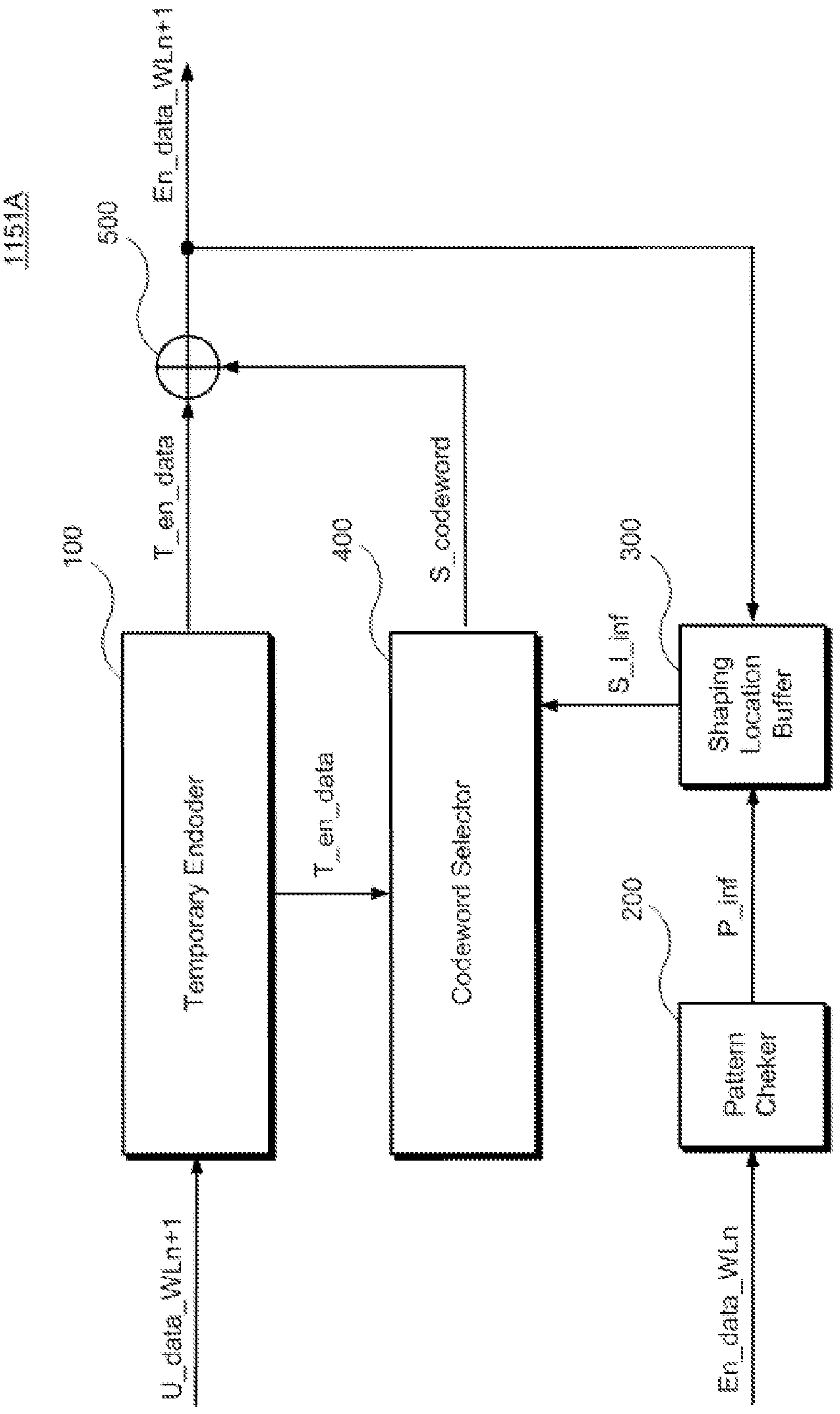
FIG. 10 is a block diagram illustrating a shaping encoder illustrated in FIG. 9, according to an embodiment.

FIG. 10 is a block diagram illustrating the shaping encoder 1151A illustrated in FIG. 9, according to an embodiment. Referring to FIG. 10, the shaping encoder 1151A may include a temporary encoder 100, a pattern checker 200, a shaping location buffer 300, a codeword selector 400, and an operator 500.

For ease of description, in FIG. 10, an example is provided in which a first wordline WL1 to an n-th wordline WLn are sequentially programmed and the shaping encoder 1151A encodes user data to be programmed into an (n+1)-th wordline WLn+1 (e.g., a target wordline).

The temporary encoder 100 may receive user data U_data_WLn+1 to be programmed into the (n+1)-th wordline WLn+1 (e.g., the target wordline) through a host interface. The temporary encoder 100 may generate temporarily encoded data T_en_data through a temporary encoding operation.

In an example embodiment, the temporary encoder 100 may apply a generator matrix of polar codes to the user data U_data_WLn+1 to generate temporarily encoded data T_en_data.

The pattern checker 200 may receive the data En_data_WLn programmed in an n-th wordline WLn (e.g., an adjacent wordline). The data programmed into the n-th wordline WLn may be data programmed after being encoded by the shaping encoder 115A in consideration of a program state of an (n−1)-th wordline WLn−1.

The pattern checker 200 may check a program state of each of the adjacent cells connected to the n-th wordline WLn, and may categorize each of the adjacent cells as one of a plurality of states. For example, the pattern checker 200 may categorize adjacent cells as a first state P_L and a second state P_H, based on the program states. The first state P_L may include program states corresponding to a low threshold voltage among program states of the memory cells, and the second state PH may include program states corresponding to a high threshold voltage among the program states of the memory cells.

The pattern checker 200 may generate program pattern information P_inf based on categorization information of adjacent cells. The program pattern information P_inf may include information related to whether the program state of each of the adjacent cells, connected to the n-th wordline WLn, is the first state P_L or the second state P_H.

The shaping location buffer 300 may generate shaping location information S_1_inf based on the program pattern information P_inf. The shaping location information S_1_inf may include location information of a shaping target cell. Alternatively or additionally, the shaping location buffer 300 may update the shaping location information S_1_inf based on an encoding result value EN_data_WLn+1.

The codeword selector 400 may receive the temporary encoding data T_en_data from the temporary encoder 100. The codeword selector 400 may receive the shaping location information S_I_inf from the shaping location buffer 300.

The codeword selector 400 may select a codeword to be applied to the temporary encoding data T_en_data from among a plurality of codewords based on the shaping location information S_I_inf, and may apply the selected codeword. For example, the codeword selector 400 may select a codeword such that data to be programmed into a target cell corresponding to an adjacent cell in the first state P_L satisfies a first data condition and data to be programmed into a target cell corresponding to an adjacent cell in the second state P_H satisfies the second state P_H. In an example embodiment, the codeword selector 400 may select and output a codeword S_codeword satisfying the first data condition and the second data condition to the greatest extent.

The operator 500 may perform a first operation on the temporary encoding data T_en_data and the selected codeword S_codeword to generate an encoding result En_data_WLn+1. In an example embodiment, the first operation may be an XOR operation. However, the present disclosure is not limited thereto.

In an example embodiment, when user data U_data_WLn+1 to be programmed into an (n+1)-th wordline WLn+1 (e.g., the target wordline) includes a plurality of logical page data, encoding results may be sequentially generated for each logical page. For example, in the case of a TLC, first encoded data to third encoded data corresponding to each of the first to third logical pages may be generated as encoding result values.

In such an embodiment, when the first encoded data is generated as a result value for the data of the first logical page, the first encoded data may be fed back to the shaping location buffer 300.

The shaping location buffer 300 may update shaping the location information S_1_inf based on the first encoded data. The shaping location buffer 300 may update the shaping location information S_1_inf by excluding a location of a target cell, satisfying the first data condition or the second data condition, from a subsequent shaping target. The updated shaping location information S_1_inf may be provided to the codeword selector 400, and may be used in an encoding operation on the second logical page.

The codeword selector 400 may select a codeword satisfying the first and second data conditions to the greatest extent for target cells indicated in the updated shaping location information S_1_inf. For example, the codeword selector 400 may exclude target cells, already satisfying the first and second data conditions through encoding of the data of the first logical page, from the shaping target. Accordingly, the codeword selector 400 may select codewords satisfying data conditions of only a portion of the memory cells. As a result, program state shaping may be performed relatively more efficiently and accurately when compared to related storage devices.

In an embodiment, the shaping encoder 1151A may set the first and second data conditions for each of a plurality of logical page data in consideration of a program state of an adjacent wordline, and may sequentially perform encoding such that each logical page satisfies the first and second data conditions. Alternatively or additionally, the shaping encoder 1151A may update location information of cells, which may be needed to satisfy the first and second data conditions when encoding next logical page data, in consideration of a result obtained through encoding previously performed on logic page data. Accordingly, an encoding operation may be performed relatively more efficiently when compared to related storage devices.

Hereinafter, an example of an operation of the shaping encoder 1151A is described with reference to FIGS. 11A-11C, 12A-12C, 13A-13B, and 14A-14C.

FIG. 11A is a diagram illustrating a portion of data programmed in an n-th wordline WLn, an adjacent wordline, in a TLC cell and a program state corresponding thereto, according to an embodiment.

In the case of a TLC cell, data programmed into an n-th wordline WLn may include first logical page data to third logical page data. The first logical page data to the third logical page data may be and/or may include data of a least significant bit (LSB) page, data of a central significant bit (CSB) page, and data of a most significant bit (MSB) page, respectively.

For example, as shown in FIG. 11A, first to eighth memory cells MC1 to MC8 connected to the n-th wordline WLn (e.g., an adjacent wordline) may be programmed to states E, P7, P4, P1, P2, P6, P5, and P3, respectively. In such an example, data of the first to third logical pages LSB, CSB, and MSB corresponding to the n-th wordline WLn may be "[11000110]", "[10110010]", and "[11011000]", respectively.

FIG. 11B is a diagram illustrating program pattern information on each adjacent cell illustrated in FIG. 11A, according to an embodiment. Referring to FIG. 11B, the first, fourth, fifth, and eighth memory cells MC1, MC4, MC5, and MC8 may be in a first state, and the second, third, sixth, and seventh memory cells MC2, MC3, MC6, and MC7 may be in a second state.

FIG. 11C is a diagram illustrating a portion of user data to be programmed into an (n+1)-th wordline WLn+1, a program target wordline, and a program state corresponding thereto, according to an embodiment.

As shown in FIG. 11C, the user data to be programmed into the (n+1)-th wordline WLn+1 may include data of a first logical page corresponding to LSB, data of a second logical page corresponding to CSB, and data of a third logical page corresponding to MSB.

Figure 12A:
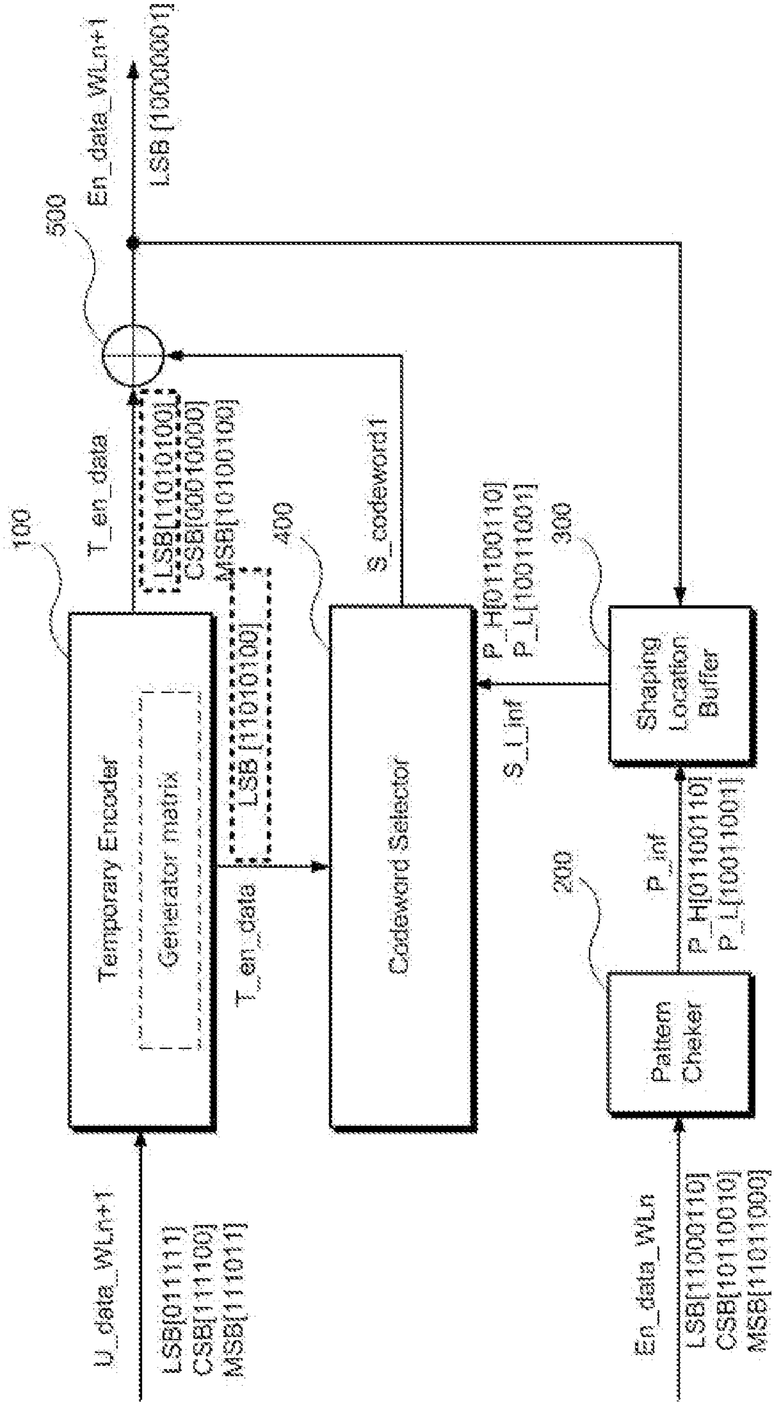

FIGS. 12A to 12C are diagrams illustrating an operation of encoding the data of the first logical page LSB included in the data to be programmed into the (n+1)-th wordline WLn+1 shown in FIG. 11C, according to an embodiment.

Referring to FIG. 12A, the temporary encoder 100 may receive user data to be programmed into an (n+1)-th wordline WLn+1. For example, the temporary encoder 100 may receive the user data shown in FIG. 11C.

The temporary encoder 100 may apply a generator matrix of polar codes to data of the first to third logical pages to generate temporarily encoded data T_en_data. In an example embodiment, the temporary encoder 100 may apply a generator matrix of m×n to the data of the first to third logical pages to generates temporarily encoded data T_en_data, where m is a positive integer greater than zero (0), and n is equal to $2^a$. A generator matrix of 6×8 (e.g., m=6, a=3, n=8), used in the temporary encoder 100, as shown in FIG. 12B is only a non-limiting example. That is, the present disclosure is not limited in this regard, and other examples of generator matrices having different dimensions are possible without departing from the scope of the present disclosure.

The pattern checker 200 may receive data programmed into an n-th wordline WLn (e.g., an adjacent wordline). For example, the pattern checker 200 may receive data En_data_WLn as illustrated in FIG. 11A. The pattern checker 200 may generate program pattern information P_inf for the received data.

The pattern checker 200 may generate program pattern information P_inf as, for example, P_L[10011001] and P_H[01100110]. P_L[10011001] may include location information of an adjacent cell in a first state, and P_H [01100110] may include location information of an adjacent cell in a second state.

The shaping location buffer 300 may generate shaping location information S_I_inf based on the program pattern information P_inf. When an encoding target is data of the first logical page (e.g., LSB), the shaping location information S_I_inf may be the same as the program pattern information P_inf. For example, the shaping location buffer 300 may determine that shaping may need to be performed for all target cells indicated in the program pattern information P_inf.

According to the shaping location information S_I_inf, it may be understood that target cells needed to satisfy the first data condition are the first, fourth, fifth, and eighth memory cells MC1, MC4, MC5, and MC8, and target cells needed to satisfy the second data condition are second, third, sixth, and, seventh memory cells MC2, MC3, MC6, and MC7.

The codeword selector 400 may receive temporarily encoded data T_en_data corresponding to the first logical page LSB from the temporary encoder 100. For example, the temporarily encoded data T_en_data may be LSB [11010100].

In such an example, the codeword selector 400 may apply a plurality of codewords to the temporarily encoded data T_en_data, LSB[11010100]. The codeword selector 400 may select and output a codeword S_codeword1, satisfying a first data condition and a second data condition to the greatest extent, from among the plurality of codewords.

Referring to FIG. 12C, the first data condition may be a data condition allowing data to be programmed into a target cell, corresponding to an adjacent cell in a first state P_L to have a program pattern other than a first shaping target pattern. Since LSB data is "1" when the first shaping target pattern is P7, data of the first shaping target pattern may be "1". For example, the first data condition corresponding to the first logical page LSB of the temporarily encoded data T_en_data may be not "1". In such an example, the codeword selector 400 may determine that the LSB data corresponding to the first and fourth memory cells MC1 and MC4 do not satisfy the first data condition.

The second data condition may be a data condition preventing data to be programmed in a target cell, corresponding to an adjacent cell in a second state P_H, from having the second shaping target pattern. Since the corresponding LSB data is "1" when the second shaping target pattern is E, data of the second shaping target pattern corresponding to the data of the first logical page LSB of the temporarily encoded data T_en_data may be "1". For example, the second data condition corresponding to the first logical page LSB of the temporarily encoded data T_en_data may be not "1". In such an example, the codeword selector 400 may determine that the LSB data corresponding to the second and sixth memory cells MC2 and MC6 do not satisfy the second data condition.

As a result, the codeword selector 400 may determine that in the first logical page LSB, the data to be programmed into the first, second, fourth, and sixth memory cells MC1, MC2, MC4, and MC6 does not satisfy the first or second data condition.

The codeword selector 400 may apply a plurality of codewords to the data of the first logical page LSB of the temporarily encoded data T_en_data to generate data to which a codeword is to be applied. In an example embodiment, the codeword selector 400 may perform an XOR operation on the data of the first logical page LSB of the temporarily encoded data T_en_data and each of the plurality of codewords to generate data to which the codeword has been applied. However, the present disclosure is not limited in this regard, and the codeword selector 400 may perform another type of operation to generate the data to which the codeword has been applied.

The codeword selector 400 may select a codeword S_codeword1 such that data, to which a codeword has been applied, satisfies the first or second data condition to the greatest extent. In the example embodiment of FIG. 12A, the selected codeword S_codeword1 corresponding to the first logical page LSB may be "[01010101]".

The operator 500 may perform an operation on the temporarily encoded data LSB[11010100] corresponding to the first logical page LSB and the selected codeword S_codeword1 to generate the first encoded data En_data_WLn+1 corresponding to the first logical page LSB. For example, the encoded data En_data_WLn+1 corresponding to the first logical page LSB may be LSB [10000001]. In such an example, it may be understood that in the encoded data En_data_WLn+1 corresponding to the first logic page LSB, compared with the LSB [11010100] that is the temporarily encoded data T_en_data corresponding to the first logic page LSB, data of the fourth target cell MC4 satisfies the first data condition and data of the second target cell MC2 and the sixth target cell MC6 satisfies the second data condition.

The encoded data En_data_WLn+1 corresponding to the first logical page LSB may be fed back to the shaping location buffer 300. Since the fourth target cell MC4 satisfies the first data condition and the data of the second target cell MC2 and the sixth target cell MC6 satisfy the second data condition through encoding, information of the shaping location information S_I_inf, corresponding to the second target cell MC2, the fourth target cell MC4, and the sixth target cell MC6, may be updated. In addition, in the encoded data En_data_WLn+1 corresponding to the first logic page, the fifth target cell MC5 satisfies the first data condition and the third target cell MC3 and the seventh target cell MC7 satisfy the second data condition. Therefore, information of the shaping location information S_I_inf, corresponding to the third, fifth, and seventh target cells MC3, MC5, and MC7, may be updated together.

As a result, the shaping location buffer 300 may update the shaping location information S_I_inf to exclude the second, third, fourth, fifth, sixth, and seventh target cells MC2, MC3, MC4, MC5, MC6, and MC7 from the shaping target.

Figure 13A:
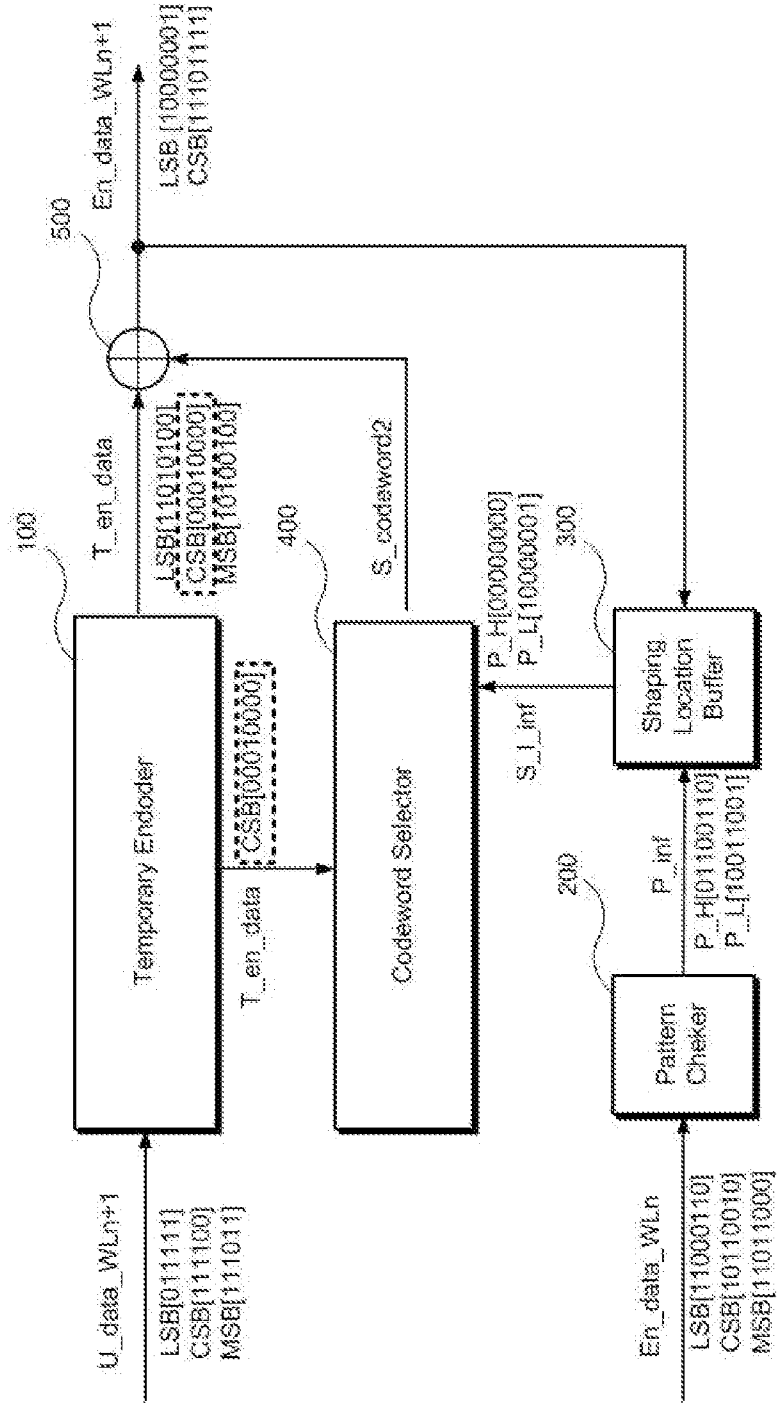

FIGS. 13A and 13B are diagrams illustrating an operation of encoding data of a second logical page CSB of the data to be programmed into the (n+1)-th wordline WLn+1 illustrated in FIG. 11C, according to an embodiment.

As described with reference to FIG. 12A, the shaping location buffer 300 may update shaping location information S_I_inf to exclude second, third, fourth, fifth, sixth, and seventh target cells MC2, MC3, MC4, MC5, MC6, and MC7 from a shaping target. Accordingly, as illustrated in FIG. 13A, from the shaping location information S_I_inf, it may be understood that target cells, needed to satisfy the first data condition, are the first and eighth memory cells MC1 and MC8 and a cell, needed to satisfy the second data condition, is not present.

The codeword selector 400 may receive temporarily encoded data T_en_data corresponding to a second logical page CSB from the temporary encoder 100. The temporarily encoded data T_en_data may be CSB[00010000].

In such an example, the codeword selector 400 may apply a plurality of codewords to temporarily encoded data T_en_data, CSB[00010000]. The codeword selector 400 may select and output the codeword S_codeword2, satisfying the first data condition and the second data condition to the greatest extent, from among the plurality of codewords.

Referring to FIG. 13B, the first data condition may be a data condition allowing data to be programmed into a target cell, corresponding to an adjacent cell in a first state P_L to have a program pattern other than the first shaping target pattern. When CSB data corresponding to the first shaping target pattern is "0", data of the first shaping target pattern corresponding to the second logical page CSB may be "0". For example, the first data condition corresponding to the second logical page CSB of the temporarily encoded data T_en_data may be not "0". In the example of FIG. 13A, the codeword selector 400 may determine that the first data condition is not satisfied in the first and eighth memory cells MC1 and MC8.

The second data condition may be a data condition preventing data to be programmed in a target cell, corresponding to an adjacent cell in the second state P_H, from having a second shaping target pattern. When the CSB data corresponding to the second shaping target pattern is "1", the second shaping target pattern corresponding to the second logical page CSB may be "1". For example, the second data condition corresponding to the second logical page CSB of the temporarily encoded data T_en_data may be not "1".

The codeword selector 400 may apply a plurality of codewords to the data of the second logical page CSB, and may select a codeword S_codeword2 such that the data applied with the codeword satisfy the first or second data condition to the greatest extent in a cell location indicated by the shaping location information S_I_inf.

In the example embodiment of FIG. 13A, a codeword S_codeword2 corresponding to the data, satisfying the first data condition in the first and eighth memory cells MC1 and MC8 to the greatest extent, may be selected from among the codewords. In the example embodiment of FIG. 13A, the codeword S_codeword2 selected corresponding to the second logical page CSB may be "[11111111]".

Referring to FIG. 13A, the operator 500 may perform an operation on the temporarily encoded data CSB[00010000] corresponding to the second logical page CSB and the codeword S_codeword2 to generate encoded data En_data_WLn+1 corresponding to the second logical page CSB. For example, the encoded data En_data_WLn+1 corresponding to the second logical page CSB may be CSB [11101111].

The encoded data En_data_WLn+1 corresponding to the second logical page CSB may be fed back to the shaping location buffer 300. In the encoded data En_data_WLn+1 corresponding to the second logical page CSB, data of the first target cell MC1 and data of the eighth target cell MC satisfy the first data condition, so that information of the shaping location information S_I_inf, corresponding to the first and eighth target cells MC1 and MC8, may be updated.

As a result, the shaping location buffer 300 may update the shaping location information S_I_inf to additionally exclude the first and eighth target cells MC1 and MC8 from the shaping target.

Figure 14A:
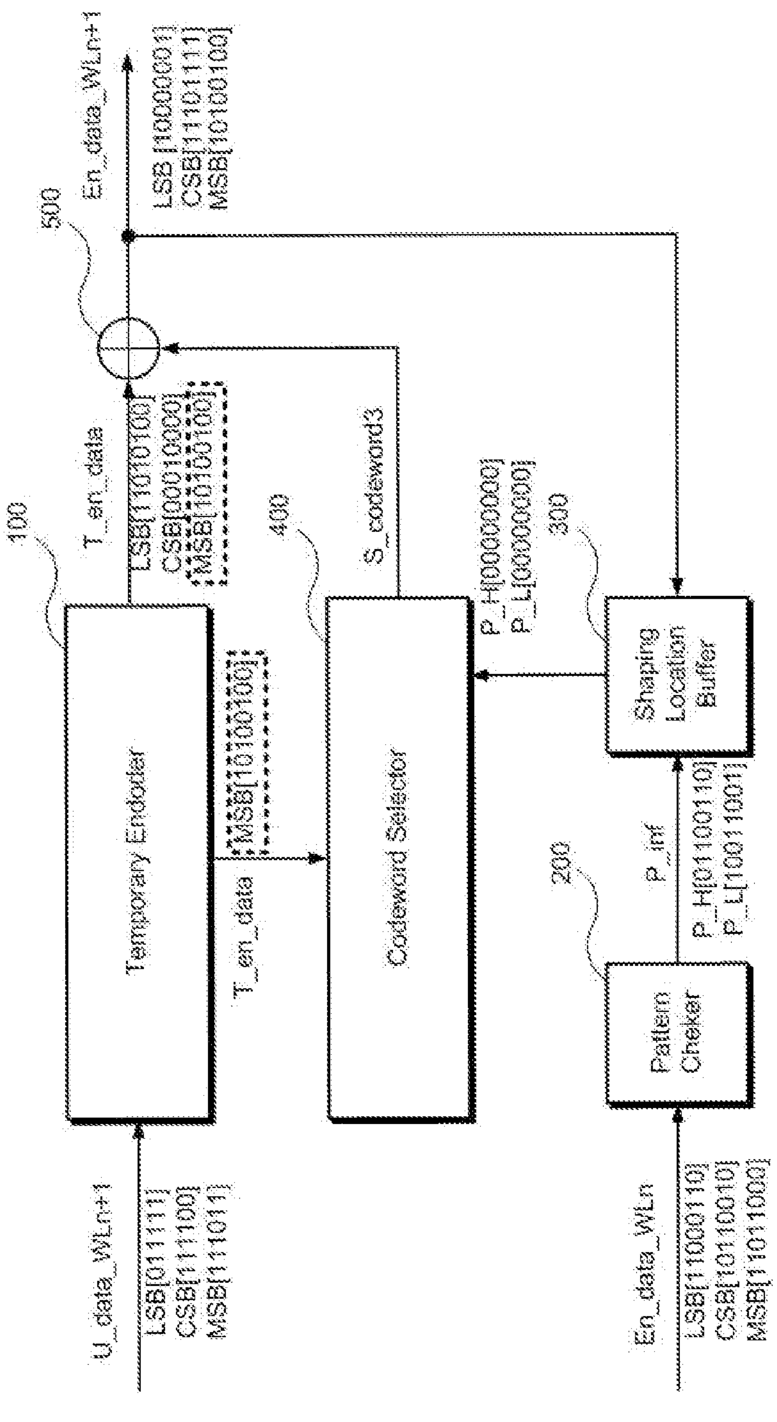

FIGS. 14A to 14C are diagrams illustrating an operation of encoding data of a third logical page MSB, among data to be programmed into the n+1th wordline WLn+1 illustrated in FIG. 11C, according to an embodiment.

As described in FIG. 13A, the shaping location buffer 300 may update the shaping location information S_I_inf to exclude the first and eighth target cells MC1 and MC8 from a shaping target.

Accordingly, as shown in FIG. 14A, from the shaping location information S_I_inf, it may be understood that there is no cell needed to satisfy the first or second data condition.

The codeword selector 400 may receive temporarily encoded data T_en_data corresponding to the third logical page MSB from the temporary encoder 100. The temporarily encoded data T_en_data may be MSB[10100100].

The codeword selector 400 may apply a plurality of codewords to the temporarily encoded data T_en_data, MSB[10100100]. The codeword selector 400 may select a codeword, satisfying the first or second data condition to the greatest extent, in a location of the target cell indicated by the shaping location information S_I_inf.

Referring to FIG. 14B, each of the first data condition and the second data condition corresponding to the third logical page MSB may be not "1". However, in the embodiment of FIG. 14A, according to the updated shaping location information (S_I_inf), there is no cell needed to satisfy the first or second data condition. Therefore, an arbitrary codeword may be selected and output. In an example embodiment, a codeword S_codeword3 may be selected and output, and the codeword S_codeword3 may be "[00000000]".

Continuing to refer to FIG. 14A, the operator 500 may perform an operation on the temporarily encoded data MSB[10100100] corresponding to the third logical page MSB and the codeword S_codeword3 to generate encoded data En_data_WLn+1 corresponding to the third logic page MSB. For example, the encoded data En_data_WLn+1 corresponding to the third logical page MSB may be MSB [10100100].

FIG. 14C illustrates a program state corresponding to encoded data En_data_WLn+1, as compared with FIG. 11C illustrating a program state corresponding to user data before being encoded. From FIG. 11C, it may be understood that a target cell MC5 adjacent to a cell of an adjacent wordline in the first state has a first shaping target pattern (e.g., the state P7), and target cells MC2 and MC5 adjacent to an adjacent wordline cell in the second state have a second shaping target pattern (e.g., the state E).

Alternatively, from FIG. 14C, it may be understood that first, fourth, fifth, and eighth target cells MC1, MC4, MC5, and MC8 adjacent to an adjacent wordline cell in the first state have a first shaping target pattern (e.g., the state P7), and second, third, sixth, and seventh memory cells MC2, MC3, MC6, and MC7 adjacent to an adjacent wordline cell in the second state do not have the second shaping target pattern (e.g., the state E).

In an example embodiment, the shaping encoder 1151A may set first and second data conditions for each of a plurality of pieces of logical page data in consideration of a program state of an adjacent wordline, and may sequentially perform encoding such that each logic page satisfies the first and second data conditions. Alternatively or additionally, the shaping encoder 1151A may update location information of a cell, needed to satisfy the first and second data conditions when encoding next logical page data, in consideration of a result obtained through encoding previously performed on next logic page data. Accordingly, defective program patterns may be removed relatively efficiently and accurately when compared to related storage devices.

Figure 15:
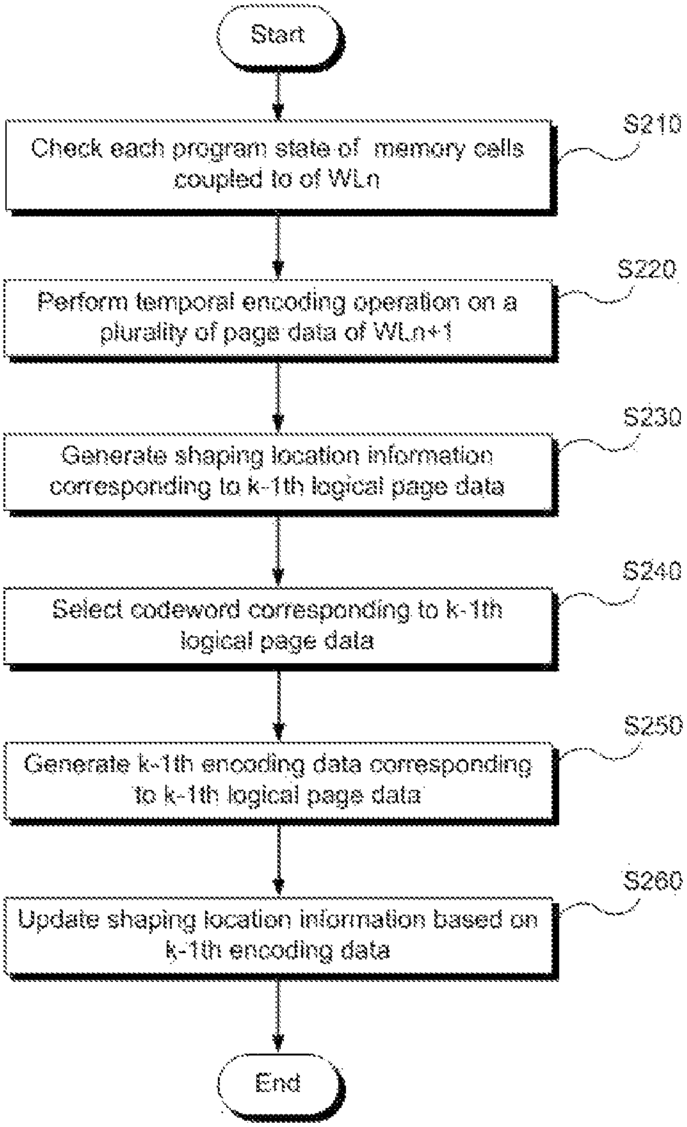
FIG. 15 is a diagram illustrating an example of an operation of a state shaping circuit, according to an example embodiment.

FIG. 15 is a diagram illustrating an example of an operation of a state shaping circuit 1150A, according to an example embodiment.

In operation S210, the state shaping circuit 1150A may check a program state of each of adjacent cells connected to an n-th wordline WLn that has been programmed. The n-th wordline may be a wordline adjacent to an (n+1)-th wordline to be programmed.

In an example embodiment, the state shaping circuit 1150A may categorize the program state of each of the adjacent cells as a first state and a second state. The first state may be a program state corresponding to a low threshold voltage from among program states of each memory cell, and the second state may be a program state corresponding to a high threshold voltage among the program states of each memory cell.

In an example embodiment, when the number of bits stored in a memory cell is "a", an erase state and states P1 to P$2^{a-1}$-1 may each be a first state, and states P$2^{a-1}$ to P$2^{a}$-1 may each be a second state, where a is a positive integer greater than zero (0). However, the present disclosure is not limited thereto.

In an example embodiment, the state shaping circuit 1150A may check a program state of each of adjacent cells to identify memory cells in the first state and the second state and to categorize adjacent cells, belonging to neither the first state nor the second state, as a third state. In such an example, when an adjacent cell has an erase state and "b" program states, the erase state and the lower (b−1)/3 program states may be categorized as the first state and upper (b−1)/3 program states may be categorized as the second state, where b is a positive integer greater than zero (0). In an embodiment, the remaining program states may be categorized as the third state.

The state shaping circuit 1150A may generate program pattern information. The program pattern information may include location information of adjacent cells in a first state and location information of adjacent cells in a second state, from among the adjacent cells.

In operation S220, a temporary encoding operation may be performed on user data to be programmed into an (n+1)-th wordline WLn+1 to generate temporarily encoded data.

The state shaping circuit 1150A may apply a generator matrix of polar codes to generate temporarily encoded data.

In FIG. 15, operation S220 is illustrated as being performed after operation S210. However, example embodiments are not limited thereto. For example, operation S210 may be performed after operation S220.

In operation S230, the state shaping circuit 1150A may generate shaping location information on the (k−1)-th logical page data based on the program pattern information, where k is a positive integer greater than one (1). Shaping location information S_1_inf on the (k−1)-th logical page data may include location information of target cells connected to the (n+1)-th wordline WLn+1 to be a shaping target during an encoding operation on the (k−1)-th logical page data.

In an example embodiment, the shaping location information S_1_inf on the (k−1)-th logical page data may indicate that all target cells of the (n+1)-th wordline WLn+1 are shaping targets. That is, a target cell corresponding to an adjacent cell in the first state may be needed to have a first data condition and a target cell corresponding to an adjacent cell in the second state may be needed to have the second data condition.

In operation S240, the state shaping circuit 1150A may select a codeword for data of the (k−1)-th logical page. When k is 2, for example, when a codeword for the first logical page data is selected, the state shaping circuit 1150A may apply a plurality of codewords to data of the first logical page, among the temporarily encoded data.

In an example embodiment, the state shaping circuit 1150A may select a codeword satisfying the first data condition and the second data condition to the greatest extent for a target cell indicated by the shaping location information of the data of the first logical page.

In an example embodiment, the first data condition is a data condition allowing target cells adjacent to a cell in the first program state to have a program pattern other than the first shaping target pattern, and the second data condition may be a data condition allowing target cells adjacent to the adjacent cell in the second state to have a program pattern other than the second shaping target pattern.

In an example embodiment, the first shaping target pattern may be in a program state corresponding to a highest threshold voltage and the second shaping target pattern may be in a program state corresponding to an erase state, among the program states. However, the present disclosure is not limited thereto.

In operation S250, the state shaping circuit 1150A may generate (k−1)-th encoded data on the (k−1)-th logical page data.

In an example embodiment, the state shaping circuit 1150A may apply a selected codeword to temporarily encoded data corresponding to the (k−1)-th logical page data to generate (k−1)-th encoded data.

In operation S260, the state shaping circuit 1150A may update shaping location information based on the (k−1)-th encoded data. The updated shaping location information may be used as shaping location information on a k-th logical page.

In an example embodiment, the state shaping circuit 1150A may update shaping location information based on whether the (k−1)-th encoded data satisfies the first or second data condition for the (k−1)-th logical page data. For example, the shaping location information may be updated by excluding location information of a target cell, satisfying the first or second data condition for the (k−1)-th logical page data, from among target cells indicated in the shaping location information.

When the number of logical page data corresponding to the (n+1)-th wordline is “a”, operations S240, S250, and S260 may be repeated until “k” becomes equal to “a”.

When “a” pieces of encoded data are generated, the “a” pieces of encoded data may be transmitted to the nonvolatile memory device 1200 together with codewords applied to each encoded data.

According to an example embodiment, first and second data conditions are set for each of a plurality of logical page data in consideration of a program state of an adjacent wordline, and encoding may be sequentially performed such that each logical page satisfies the first and second data conditions. Alternatively or additionally, location information of a cell, needed to satisfy the first and second data conditions when next logical page data is encoded, may be updated in consideration of a result obtained through encoding previously performed on logical page data, and thus defective program patterns may be removed more efficiently and accurately, when compared to related storage devices.

As set forth above, a storage device, according to example embodiments, may encode data to be programmed into a target wordline to have data conditions varying depending on a program state of an adjacent wordline. Accordingly, interference between wordlines may be reduced during a program operation, resulting in improved reliability of data, when compared to related storage devices.

While example embodiments have been shown and described above, it may be apparent to those skilled in the art that modifications and variations could be made without departing from the scope of the present disclosure as defined by the appended claims.

What is claimed is:

1. A storage device, comprising:

a nonvolatile memory device comprising a plurality of first memory cells coupled to a first wordline and a plurality of second memory cells coupled to a second wordline, the first wordline and the second wordline being adjacent to each other; and a storage controller configured to control the nonvolatile memory device, the storage controller comprising a state shaping circuit including a shaping encoder, wherein the shaping encoder is configured to:

check whether a program state of each of the plurality of first memory cells is at least one of a first state and a second state;

encode data to be programmed into the plurality of second memory cells, based on the program state of each of the plurality of first memory cells, the program state comprising the first state and the second state; and encode the data to be programmed into the second wordline such that a first portion of the data to be written into a first portion of the plurality of second memory cells satisfies a first condition, and a second portion of the data to be written into a second portion of the plurality of second memory cells satisfies a second condition, the first portion of the plurality of second memory cells being adjacent to a first portion of the plurality of first memory cells in the first state, and the second portion of the plurality of second memory cells being adjacent to a second portion of the plurality of first memory cells in the second state.

2. The storage device of claim 1, wherein the first condition is configured to allow the first portion of the data, programmed into the first portion of the plurality of second memory cells adjacent to the first portion of the plurality of first memory cells in the first state, to have a first program pattern other than a first shaping target pattern, and wherein the second condition is configured to allow the second portion of the data, programmed into the second portion of the plurality of second memory cells adjacent to the second portion of the plurality of first memory cells in the second state, to have a second program pattern other than a second shaping target pattern.

3. The storage device of claim 2, wherein the storage controller is further configured to:

select a codeword, from among a plurality of codewords, corresponding to data that maximizes satisfying at least one of the first condition and the second condition, from among data generated by applying the plurality of codewords to the data to be programmed into the plurality of second memory cells;

encode, based on the selected codeword, the data to be programmed into the plurality of second memory cells; and output the encoded data as an encoding result value.

4. The storage device of claim 2, wherein the data to be programmed into the plurality of second memory cells comprises a plurality of pieces of logical page data, and wherein the storage controller is further configured to:

perform temporary encoding on the plurality of pieces of logical page data;

select a codeword satisfying at least one of the first condition and the second condition set for each of the plurality of pieces of logical page data being temporarily encoded; and apply a corresponding codeword to each of the plurality of pieces of logical page data to generate an encoding result value for each of the plurality of pieces of logical page data.

5. The storage device of claim 4, wherein the storage controller is configured to:

generate shaping location information based on the program state of each of the plurality of first memory cells;

update the shaping location information based on data generated by encoding (n-1)-th logical page data and at least one of the first condition and the second condition being satisfied by the encoded (n-1)-th logical page data, n being a positive integer greater than zero; and perform an encoding operation on n-th logical page data based on the updated shaping location information.

6. The storage device of claim 5, wherein the shaping location information comprises first location information of the plurality of second memory cells needed to satisfy the first condition, and second location information of the plurality of second memory cells needed to satisfy the second condition.

7. The storage device of claim 6, wherein the storage controller is further configured to:

update the shaping location information by excluding location information of a second memory cell satisfying at least one of the first condition the second condition for the (n-1)-th logical page data;

select a codeword that maximizes satisfying at least one of the first condition and the second condition for data of a location of a second memory cell indicated by the updated shaping location information, as a codeword for the n-th logical page data; and output encoding data, obtained by applying the selected codeword to temporarily encoded n-th logical page data, as an encoding result value for the n-th logical page data.

8. A method of operating a storage device, the method comprising:

checking whether a program state of each of a plurality of first memory cells, connected to a first wordline, is at least one of a first state and a second state; and encoding data to be programmed into a plurality of second memory cells, connected to a second wordline, based on the program state of each of the plurality of first memory cells, wherein the first wordline and the second wordline are adjacent to each other, wherein the encoding of the data to be programmed into the plurality of second memory cells comprises encoding the data to be programmed into the second wordline such that a first portion of the data to be written into a first portion of the plurality of second memory cells satisfies a first condition, and a second portion of the data to be written into a second portion of the plurality of second memory cells satisfies a second condition.

9. The method of claim 8, wherein the first condition is configured to allow the first portion of the data, programmed into the first portion of the plurality of second memory cells adjacent to the first portion of the plurality of first memory cells in the first state, to have a first program pattern other than a first shaping target pattern, and wherein the second condition configured to allow the second portion of the data, programmed into the second portion of the plurality of second memory cells adjacent to the second portion of the plurality of first memory cells in the second state, to have a second program pattern other than a second shaping target pattern.

10. The method of claim 9, wherein the encoding of the data to be programmed into the plurality of second memory cells comprises:

selecting a codeword, from among a plurality of codewords, corresponding to data that maximizes satisfying at least one of the first condition and the second condition, from among data generated by applying the plurality of codewords to the data to be programmed into the plurality of second memory cells.

11. The method of claim 8, wherein the data to be programmed into the plurality of second memory cells comprises a plurality of pieces of logical page data, and wherein the encoding of the data to be programmed into the plurality of second memory cells further comprises:

performing temporary encoding on the plurality of pieces of logical page data;

selecting a codeword that maximizes satisfying at least one of the first condition and the second condition set for each of the plurality of pieces of logical page data being temporarily encoded; and applying the selected codeword to each of the corresponding plurality of pieces of logical page data to generate an encoding result value for each of the plurality of pieces of logical page data.

12. The method of claim 11, wherein the encoding of the data to be programmed into the plurality of second memory cells further comprises:

generating shaping location information based on the program state of each of the plurality of first memory cells;

updating the shaping location information based on data generated by encoding (n-1)-th logical page data and at least one of the first condition and the second condition being satisfied by for the encoded (n-1)-th logical page data, n being a positive integer greater than zero; and performing an encoding operation on n-th logical page data based on the updated shaping location information.

13. The method of claim 12, wherein the shaping location information comprises first location information of the plurality of second memory cells needed to satisfy the first condition, and second location information of the plurality of second memory cells needed to satisfy the second condition.

14. The method of claim 13, wherein the updating of the shaping location information comprises:

excluding, from the shaping location information, location information of a second memory cell satisfying at least one of the first condition and the second condition for the (n-1)-th logical page data.

15. The method of claim 14, wherein the performing of the encoding operation on the n-th logical page data comprises:

selecting a codeword that maximizes satisfying at least one of the first condition and the second condition for data of a second memory cell indicated by the updated shaping location information, as a codeword for the n-th logical page data, and outputting encoding data, generated by applying the selected codeword to temporarily encoded n-th logical page data, as an encoding result value for the n-th logical page data.

16. A method of operating a storage device, the method comprising:

categorizing a program state of each of a plurality of first memory cells, connected to a first wordline, as a plurality of states;

encoding data to be programmed into a plurality of second memory cells, connected to a second wordline, based on the program state of each of the plurality of first memory cells; and programming encoded program data into the plurality of second memory cells, wherein the encoding of the data to be programmed into the plurality of second memory cells comprises encoding the data to be programmed into the plurality of second memory cells such that a first portion of the data to be written into a first portion of the plurality of second memory cells adjacent to first memory cells in a first state, from among the plurality of states, satisfies a first condition, and a second portion of the data to be written into a second portion of the plurality of second memory cells adjacent to first memory cells in a second state, from among the plurality of states, satisfies a second condition.

17. The method of claim 16, wherein the first condition is configured to allow the first portion of the data, programmed into the first portion of the plurality of second memory cells adjacent to the first portion of the plurality of first memory cells in the first state, to have a first program pattern other than a first shaping target pattern, and wherein the second condition is configured to allow the second portion of the data, programmed into the second portion of the plurality of second memory cells adjacent to the second portion of the plurality of first memory cells in the second state, to have a second program pattern other than a second shaping target pattern.

18. The method of claim 16, wherein the categorizing of the program state of each of the plurality of first memory cells comprises:

categorizing, based on the plurality of second memory cells having b program states, lower (b-1)/3 program states as the first state, wherein b is a positive integer greater than zero;

categorizing upper (b-1)/3 program states as the second state; and categorizing remaining program states as a third state.

19. The method of claim 18, wherein the data to be programmed into the plurality of second memory cells comprises a plurality of pieces of logical page data, and wherein the encoding of the data to be programmed into the plurality of second memory cells further comprises:

performing temporary encoding on the plurality of pieces of logical page data;

selecting a codeword that maximizes satisfying at least one of the first condition and the second condition set for each of the plurality of pieces of logical page data being temporarily encoded; and applying the selected codeword to each of the corresponding plurality of pieces of logical page data to generate an encoding result value for each of the plurality of pieces of logical page data.

20. The method of claim 19, wherein the encoding of the data to be programmed into the plurality of second memory cells further comprises:

generating shaping location information based on the program state of each of the plurality of first memory cells;

updating the shaping location information based on data generated by encoding (n-1)-th logical page data and at least one of the first condition and the second condition being satisfied by the encoded (n-1)-th logical page data, n being a positive integer greater than zero; and performing an encoding operation on n-th logical page data based on the updated shaping location information.

* * * * *